(12) United States Patent
Biran et al.

(10) Patent No.: US 7,383,483 B2
(45) Date of Patent: Jun. 3, 2008

(54) DATA TRANSFER ERROR CHECKING

(75) Inventors: Giora Biran, Zichron-Yaakov (IL); Zorik Machulsky, Nahariya (IL); Vadim Makhervaks, Yokneam (IL)

(73) Assignee: International Business Machines Corporation, Armonk, NY (US)

( * ) Notice: Subject to any disclaimer, the term of this patent is extended or adjusted under 35 U.S.C. 154(b) by 363 days.

(21) Appl. No.: 10/733,588

(22) Filed: Dec. 11, 2003

(65) Prior Publication Data
US 2005/0149817 A1     Jul. 7, 2005

(51) Int. Cl.
*H03M 13/00* (2006.01)
(52) U.S. Cl. .................................. 714/776; 714/758
(58) Field of Classification Search ................ 714/758, 714/776
See application file for complete search history.

(56) References Cited

U.S. PATENT DOCUMENTS

| 6,256,307 | B1 | 7/2001 | Salmonson | |
|---|---|---|---|---|
| 6,874,054 | B2* | 3/2005 | Clayton et al. | 710/310 |
| 2003/0172342 | A1* | 9/2003 | Elzur | 714/776 |
| 2004/0123013 | A1* | 6/2004 | Clayton et al. | 710/310 |
| 2005/0129045 | A1* | 6/2005 | Machulsky et al. | 370/428 |

OTHER PUBLICATIONS

Stone et al., When the CRC and TCP Checksum Disagree, 2000, ACM 1-58113-224-7/00/0008, pp. 309-318, 10 pages.*

* cited by examiner

*Primary Examiner*—M. Mujtaba K Chaudry
(74) *Attorney, Agent, or Firm*—Todd M. C. Li; Hoffman, Warnick & D'Alessandro LLC

(57) ABSTRACT

An RNIC implementation that performs direct data placement to memory where all segments of a particular connection are aligned, or moves data through reassembly buffers where all segments of a particular connection are non-aligned. The type of connection that cuts-through without accessing the reassembly buffers is referred to as a "Fast" connection because it is highly likely to be aligned, while the other type is referred to as a "Slow" connection. When a consumer establishes a connection, it specifies a connection type. The connection type can change from Fast to Slow and back. The invention reduces memory bandwidth, latency, error recovery using TCP retransmit and provides for a "graceful recovery" from an empty receive queue. The implementation also may conduct CRC validation for a majority of inbound DDP segments in the Fast connection before sending a TCP acknowledgement (Ack) confirming segment reception.

9 Claims, 17 Drawing Sheets

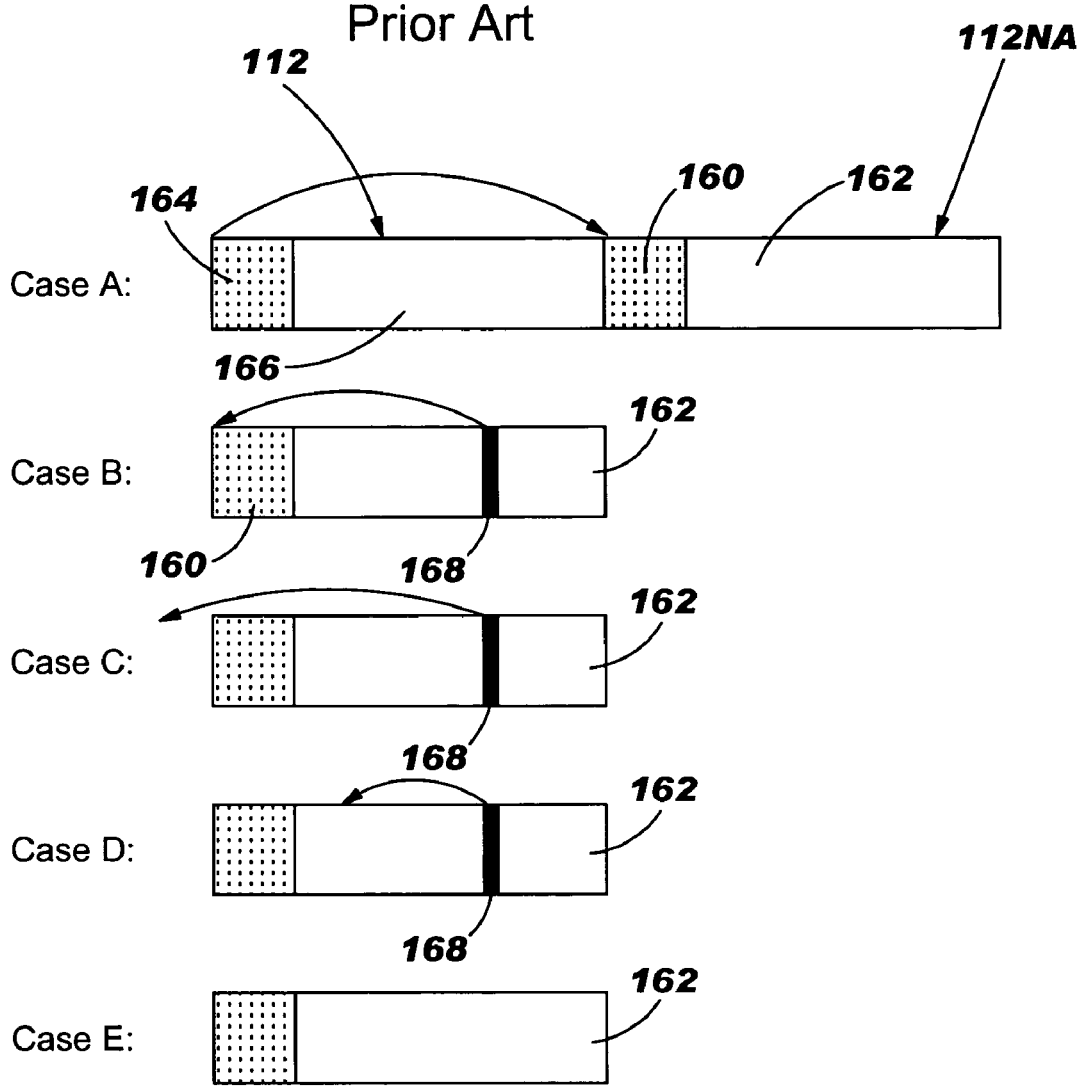

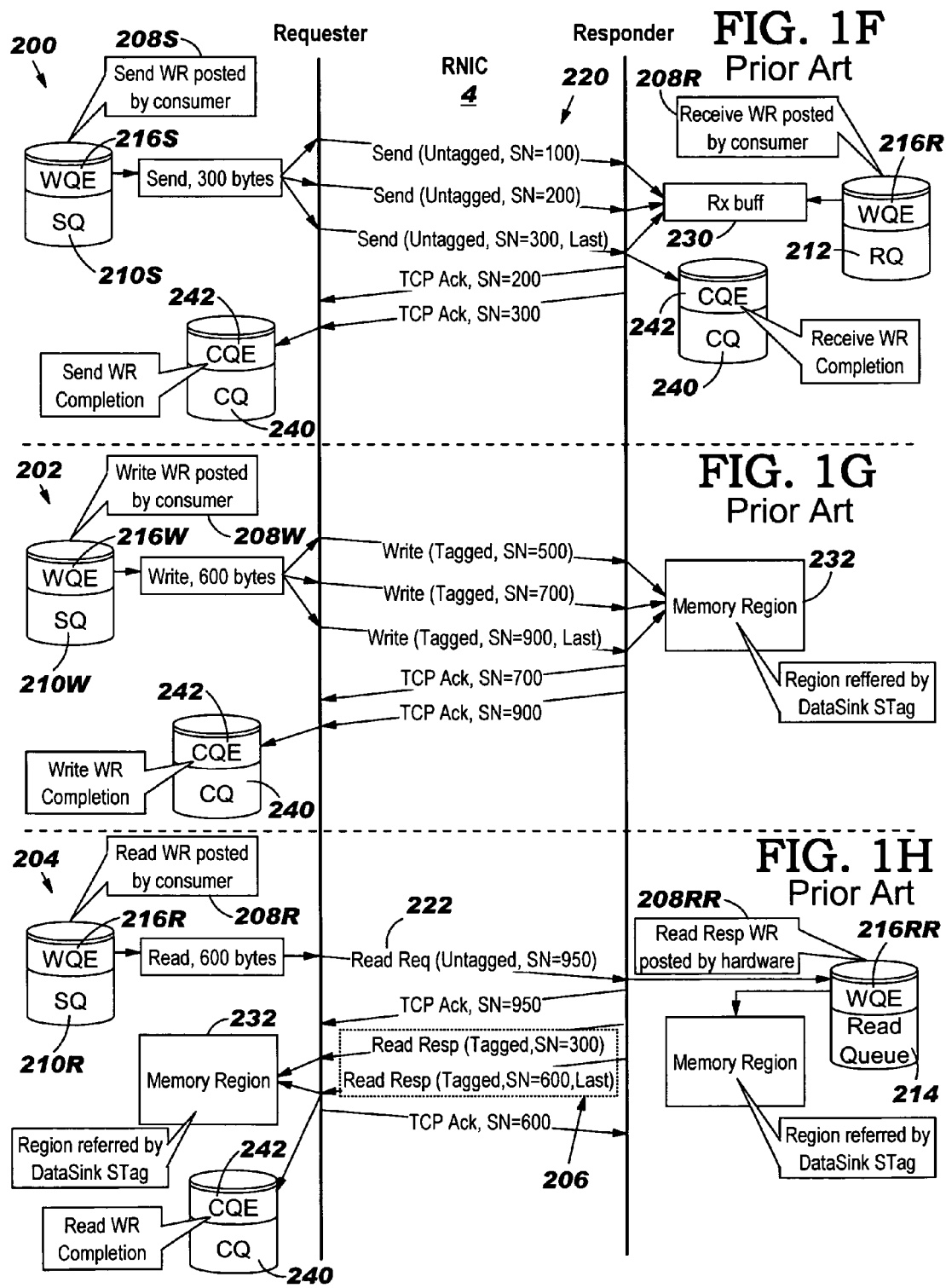

DATA TRANSFER ERROR CHECKING

BACKGROUND OF THE INVENTION

1. Technical Field

The present invention relates generally to data transfer, and more particularly, to an RDMA enabled network interface controller (RNIC) with a cut-through implementation for aligned DDP segments.

2. Related Art

1. Overview

Referring to FIG. 1A, a block diagram of a conventional data transfer environment 1 is shown. Data transfer environment 1 includes a data source 2 (i.e., a peer) that transmits a data transfer 3A via one or more remote memory data access (RDMA) enabled network interface controller(s) (RNIC) 4 to a data sink 5 (i.e., a peer) that receives data transfer 3B. RNIC 4 includes, inter alia (explained further below), reassembly buffers 6. Networking communication speeds have significantly increased recently from 10 mega bits per second (Mbps) through 100 Mbps to 1 giga bits per second (Gbps), and are now approaching speeds in the range of 10 Gbps. The communications bandwidth increase, however, is now beginning to outpace the rate at which central processing units (CPUs) can process data efficiently, resulting in a bottleneck at server processors, e.g., RNIC 4. For example, a common 1 Gbps network connection, if fully utilized, can be a large burden to a 2 GHz CPU. In particular, a CPU such as this can extend approximately half of its processing power just handling low-level transmission control protocol (TCP) processing from data coming from a network card.

One approach to solving this problem has been to implement the transmission control and Internet protocol (TCP/IP) stack in hardware finite state machines (FSM) rather than as software to be processed by a CPU. This approach allows for very fast packet processing resulting in wire speed processing of back-to-back short packets. In addition, this approach presents a very compact and powerful solution with low cost. Unfortunately, since the TCP/IP stack was defined and developed for implementation in software, generating a TCP/IP stack in hardware has resulted in a wide range of new problems. For example, problems that arise include: how to implement a software-based protocol in hardware FSMs and achieve improved performance, how to design an advantageous and efficient interface to upper layer protocols (ULPs) (e.g., application protocols) to provide a faster implementation of the ULP, and how to avoid new bottle-necks in a scaled-up implementation.

In order to address these new problems, new communication layers have been developed to lay between the traditional ULP and the TCP/IP stack. Unfortunately, protocols placed over a TCP/IP stack typically require many copy operations because the ULP must supply buffers for indirect data placement, which adds latency and consumes significant CPU and memory resources. In order to reduce the amount of copy operations, a suite of new protocols, referred to as iWARP, have been developed.

2. The Protocols

Referring to FIG. 1B, a brief overview of various protocols, including the iWARP protocols, and data transfer format structure will now be described. As can be seen, each data transfer may include information related to a number of different protocols, each for providing different functionality relative to the data transfer. For example, as shown in FIG. 1B, an Ethernet protocol 100 provides local area network (LAN) access as defined by IEEE standard 802.3; an Internet protocol (IP) 102 adds necessary network routing information; a transfer control protocol (TCP) 104 schedules outbound TCP segments 106 and satisfies delivery guarantees; and a marker with protocol data unit (PDU) alignment (MPA) protocol 108 provides an MPA frame 109 that includes a backward MPA marker(s) 110 at a fixed interval (i.e., every 512 bytes) across DDP segments 112 (only one shown, but may be stream) and also adds a length field 114 and cyclic redundancy checking (CRC) field 116 to each MPA frame 109. In addition, a direct data placement (DDP) protocol 120 segments outbound messages into one or more DDP segments 112, and reassembles one or more DDP segments into a DDP message 113; and a remote data memory access (RDMA) protocol 122 converts RDMA Write, Read, Sends into/out of DDP messages. Although only one DDP segment 112 has been shown for clarity, it should be recognized that numerous DDP segments 112 can be provided in each TCP segment 106.

With special regard to RDMA protocol 122, this protocol, developed by the RDMA Consortium, enables removal of data copy operations and reduction in latencies by allowing one computer to directly place information in another computer's memory with minimal demands on memory bus bandwidth and central processing unit (CPU) processing overhead, while preserving memory protection semantics. RDMA over TCP/IP promises more efficient and scalable computing and data transport within a data center by reducing the overhead burden on processors and memory, which makes processor resources available for other work, such as user applications, and improves infrastructure utilization. In this case, as networks become more efficient, applications are better able to scale by sharing tasks across the network as opposed to centralizing work in larger, more expensive systems. With RDMA functionality, a transmitter can use framing to put headers on Ethernet byte streams so that those byte streams can be more easily decoded and executed in an out-of-order mode at the receiver, which will boost performance—especially for Internet Small Computer System Interface (iSCSI) and other storage traffic types. Another advantage presented by RDMA is the ability to converge functions in the data center over fewer types of interconnects. By converging functions over fewer interconnects, the resulting infrastructure is less complex, easier to manage and provides the opportunity for architectural redundancy, which improves system resiliency.

With special regard to the DDP protocol, this protocol introduces a mechanism by which data may be placed directly into an upper layer protocol's (ULP) receive buffer without intermediate buffers. DDP reduces, and in some cases eliminates, additional copying (to and from reassembly buffers) performed by an RDMA enabled network interface controller (RNIC) when processing inbound TCP segments.

3. Challenges

One challenge facing efficient implementation of TCP/IP with RDMA and DDP in a hardware setting is that standard TCP/IP off-load engine (TOE) implementations include reassembly buffers in receive logic to arrange out-of-order received TCP streams, which increases copying operations. In addition, in order for direct data placement to the receiver's data buffers to be completed, the RNIC must be able to locate the destination buffer for each arriving TCP segment payload 127. As a result, all TCP segments are saved to the reassembly buffers to ensure that they are in-order and the destination buffers can be located. In order to address this problem, iWARP specifications strongly recommend to the transmitting RNIC to perform segmentation of RDMA messages in such way that the created DDP segments would be "aligned" to TCP segments. Nonetheless, non-aligned DDP segments are oftentimes unavoidable, especially where the data transfer passes through many interchanges.

Referring to FIG. 1B, "alignment" means that a TCP header 126 is immediately followed by a DDP segment 112 (i.e., MPA header follows TCP header, then DDP header), and the DDP segment 112 is fully contained in the one TCP segment 106. More specifically, each TCP segment 106 includes a TCP header 126 and a TCP payload/TCP data 127. A "TCP hole" 130 is a missing TCP segment(s) in the TCP data stream. MPA markers 110 provide data for when an out-of-order TCP segment 106 is received, and a receiver wants to know whether MPA frame 109 inside TCP segment 106 is aligned or not with TCP segment 106. Each marker 110 is placed at equal intervals (512 bytes) in a TCP stream, starting with an Initial Sequence Number of a particular connection, and points to a DDP/RDMA header 124 of an MPA frame 109 that it travels in. A first sequential identification number is assigned to a first TCP segment 106, and each Initial Sequence Number in subsequent TCP segments 106 includes an incremented sequence number.

In FIG. 1B, solid lines illustrate an example of an aligned data transfer in which TCP header 126 is immediately followed by MPA length field 114 and DDP/RDMA header 124, and DDP segment 112 is fully contained in TCP segment 106. A dashed line in DDP protocol 120 layer indicates a non-aligned DDP segment 112NA in which TCP header 126 is not immediately followed by MPA length field 114 and DDP/RDMA header 124. A non-aligned DDP segment may result, for example, from re-segmentation by a middle-box that may stand in-between sending and receiving RNICs, or a reduction of maximum segment size (MSS) on-the-fly. Since a transmitter RNIC cannot change DDP segmentation (change location of DDP headers in TCP stream), a retransmit operation may require a new, decreased MSS despite the original DDP segments creation with a larger MSS. In any case, the increase in copying operations reduces speed and efficiency. Accordingly, there is a need in the art for a way to handle aligned DDP segment placement and delivery in a different fashion than non-aligned DDP segment placement and delivery.

Another challenge relative to non-aligned DDP segment 112NA handling is created by the fact that it is oftentimes difficult to determine what is causing the non-alignment. For example, the single non-aligned DDP segment 112NA can be split between two or more TCP segments 106 and one of them may arrive and another may not arrive. In another case, some DDP segments 112NA may fall between MPA markers 110, a header may be missing, or a segment tail may be missing (in the latter case, you can partially place the segment and need to keep some information to understand where to place the remaining part, when it arrives), etc. Relative to this latter case, FIG. 1C shows a block diagram of possible situations relative to MPA marker references for one or more non-aligned DDP segments 112NA. Case A illustrates a situation in which a DDP segment header 160 of a newly received DDP segment 162 is referenced by an MPA length field 164 of a previously processed DDP segment 166. Case B illustrates a situation in which newly received DDP segment 162 header 160 is referenced by a marker 168 located inside newly received DDP segment 162. That is, marker 168 is referring to the beginning of newly received DDP segment 162. Case C illustrates a situation in which marker 168 is located in newly received DDP segment 162, but points outside of the segment. Case D illustrates a situation in which marker 168 is located in newly received DDP segment 162, and points inside the segment. Case E illustrates a situation in which no marker is located in newly received DDP segment 162. In any case, where the cause of DDP segment non-alignment cannot be determined, an RNIC cannot conduct direct data placement because there are too many cases to adequately address, and too much information/partial segments to hold in the intermediate storage. Accordingly, any solution that provides different handling of aligned and non-aligned DDP segments should address the various situations that may cause the non-alignment.

4. DDP/RDMA Operational Flow

Referring to FIGS. 1D-1H, a brief overview of DDP/RDMA operational flow will now be described for purposes of later description. With special regard to DDP protocol 120 (FIG. 1B), DDP provides two types of messages referred to as tagged and untagged messages. Referring to FIG. 1D, in a "tagged message," each DDP segment 112 (FIG. 1B) carries a steering tag ("STag") in DDP/RDMA header 124 that identifies a memory region/window in a destination buffer (e.g., a memory region 232 in FIG. 1G) on a receiver to which data can be placed directly, a target offset (TO) in this region/window and a segment payload (not shown). In this case, availability of the destination buffer is "advertised" via the STag. Referring to FIG. 1E, an "untagged message" is one in which a remote transmitter does not know buffers at a receiver, and sends a message with a queue ID (QN), a message sequence number (MSN) and a message offset (MO), which may be used by the receiver to determine appropriate buffers.

Referring to FIGS. 1F-1H, the RDMA protocol defines four types of messages: a Send 200, a Write 202, a Read 204, and a Read Response 206. Returning to FIG. 1A, a verb interface 7 presents RNIC 4 to a consumer, and includes methods to allocate and de-allocate RNIC 4 resources, and to post work requests (WR) 208 to RNIC 4. Verb interface 7 usually is implemented by a verb library 8 having two parts: user space library 9A that serves user space consumers and kernel module 9B that serves kernel space consumers. Verb interface 7 is RNIC-specific software that works with RNIC 4 hardware and firmware. There is no strict definition of what should be implemented in verb interface 7 (verb library 8), hardware and firmware. Verb interface 7 can be viewed as a single package that provides RNIC 4 services to a consumer, so the consumer can perform mainly two types of operations: management of RNIC 4 resources (allocation and de-allocation), and posting of work request(s) (WR) to RNIC 4. Examples of RNIC 4 resource management are: a queue pair allocation and de-allocation, a completion queue (hereinafter "CQ") allocation and de-allocation or memory region allocation and de-allocation. These management tasks will be described in more detail below.

As shown in FIG. 1F-1H, a consumer allocates a queue pair to which work requests 208 are posted. A "queue pair" (hereinafter "QP") is associated with a TCP connection and includes a pair of work queues (e.g., send and receive) 210, 212 as well as a posting mechanism (not shown) for each queue. Each work queue 210, 212 is a list of Work Queue Elements (WQE) 216 where each WQE holds some control information describing one work request (WR) 208 and refers (or points) to the consumer buffers. A consumer posts a work request (WR) 208 to work queues 210, 212 in order to get verb interface 7 (FIG. 1A) and RNIC 4 (FIG. 1A) to execute posted work requests (WR) 208. In addition, there are resources that may make up the QP with which the consumer does not directly interact such as a read queue 214 (FIG. 1H) and work queue elements (WQEs) 216.

The typical information that can be held by a WQE 216 is a consumer work request (WR) type (i.e., for a send WR 208S it can be RDMA Send, RDMA Write, RDMA Read, etc., for a receive WR 208R it can be RDMA Receive only), and a description of consumer buffers that either carry data to transmit or represent a location for received data. A WQE 216 always describes/corresponds to a single RDMA message. For example, when a consumer posts a send work request (WR) 208S of the RDMA Write type, verb library 8 (FIG. 1A) builds a WQE 216S describing the consumer buffers from which the data needs to be taken, and sent to the responder, using an RDMA Write message. In another example, a receive work request (WR) 208R (FIG. 1F) is present. In this case, verb library 8 (FIG. 1A) adds a WQE 216R to receive queue (RQ) 212 that holds a consumer buffer that is to be used to place the payload of the received Send message 200.

When verb library 8 (FIG. 1A) adds a new WQE 216 to send queue (SQ) 210 or receive queue (RQ) 212, it notifies (referred to herein as "rings doorbell") of RNIC 4 (FIG. 1A) that a new WQE 216 has been added to send queue (SQ)/receive queue (RQ), respectively. This "doorbell ring" operation is usually a write to the RNIC memory space, which is detected and decoded by RNIC hardware. Accordingly, a doorbell ring notifies the RNIC that there is new work that needs to the done for the specified SQ/RQ, respectively.

RNIC 4 (FIG. 1A) holds a list of send queues (SQs) 210 that have pending (posted) WQEs 216. In addition, the RNIC arbitrates between those send queues (SQs) 210, and serves them one after another. When RNIC 4 picks a send queue (SQ) 210 to serve, it reads the next WQE 216 to serve (WQEs are processed by the RNIC in the order they have been posted by a consumer), and generates one or more DDP segments 220 belonging to the requested RDMA message.

Handling of the particular types of RDMA messages will now be described with reference to FIGS. 1F-1H. As shown in FIG. 1F, RNIC (Requester) selects to serve particular send queue (SQ) 210S. It reads WQE 216S from send queue (SQ) 210S. If this WQE 216S corresponds to an RDMA Send request, RNIC generates a Send message, and sends this message to the peer RNIC (Responder). The generated message may include, for example, three DDP segments 220. When RNIC (Responder) receives the Send message, it reads WQE 216R from receive queue (RQ) 212, and places the payload of received DDP segments 220 to the consumer buffers (i.e. responder Rx buff) 230 referred by that WQE 216R. If Send Message 200 is received in-order, then the RNIC picks the first unused WQE 216R from receive queue (RQ) 212. WQEs 216R are chained in request queue (RQ) 212 in the order they have been posted by a consumer. In terms of an untagged DDP message, Send message 200 carries a Message Sequence Number (MSN) (FIG. 1E), which is initialized to one and monotonically increased by the transmitter with each sent DDP message 220 belonging to the same DDP Queue. (Tagged messages will be described relative to RDMA Write message 202 below). A DDP Queue is identified by Queue Number (QN) (FIG. 1E) in the DDP header. The RDMA protocol defines three DDP Queues: QN #0 for inbound RDMA Sends, QN #1 for inbound RDMA Read Requests, and QN #2 for inbound Terminates. Accordingly, when Send message 200 arrives out-of-order, RNIC 4 may use the MSN of that message to find the WQE 216R that corresponds to that Send message 200. One received Send message 200 consumes one WQE 216R from receive queue (RQ) 212. Lack of a posted WQE, or message data length exceeding the length of the WQE buffers, is considered as a critical error and leads to connection termination.

Referring to FIGS. 1G and 1H, an RDMA Write message 202, using tagged operations, and part of RDMA Read message 204 will now be described. To use tagged operations, a consumer needs to register a memory region 232. Memory region 232 is a virtually contiguous chunk of pinned memory on the receiver, i.e., responder in FIG. 1G. A memory region 232 is described by its starting virtual address (VA), length, access permissions, and a list of physical pages associated with that memory region 232. As a result of memory region 232 registration, a consumer receives back a steering tag (STag), which can be used to access that registered memory region 232. Access of memory region 232 by a remote consumer (e.g., requester in FIG. 1G) is performed by RNIC 4 without any interaction with the local consumer (e.g., responder in FIG. 1G). When the consumer wants to access remote memory 232, it posts a send work request (WR) 208W or 208R (FIG. 1H) of the RDMA Write or RDMA Read type, respectively. Verb library 8 (FIG. 1A) adds corresponding WQEs 216W (FIG. 1G) or 216R (FIG. 1H) to send queue (SQ) 210W or 210R, respectively, and notifies RNIC 4. When connection wins arbitration, RNIC 16 reads WQEs 216W or 216R, and generates RDMA Write message 202 or RDMA Read message 204, respectively.

With special regard to RDMA Write message 202, as shown in FIG. 1G, when an RDMA Write message 202 is received by RNIC 4, the RNIC uses the STag and TO (FIG. 1D) and length in the header of DDP segments (belonging to that message) to find the registered memory region 232, and places the payload of RDMA Write message 202 to memory 232. The receiver software or CPU (i.e., responder as shown) is not involved in the data placement operation, and is not aware that this operation took place.

With special regard to an RDMA Read message 204, as shown in FIG. 1H, when the message is received by RNIC 4 (FIG. 1A), the RNIC generates a RDMA Read Response message 206, and sends it back to the remote host, i.e., requester as shown. In this case, the receive queue is referred to as a read queue 214. Generation of RDMA Read Response 206 is also performed without involvement of the local consumer (i.e., responder), which is not aware that this operation took place. When the RDMA Read Response 206 is received, RNIC 4 (FIG. 1A) handles this message similarly to handling an RDMA Write message 204. That is, it writes to memory region 232 on the requester side.

In addition to handling consumer work requests, RNIC 4 (FIG. 1A) also notifies a consumer about completion of those requests, as shown in FIGS. 1F-1H. Completion notification is made by using completion queues 240, another RNIC resource, which is allocated by a consumer (via a dedicated function provided by verb library 8). A completion queue 240 includes completion queue elements (CQE) 242. CQEs 242 are placed to a completion queue (CQ) 240 by RNIC 4 (FIG. 1A) when it reports completion of a consumer work request (WR) 208S, 208W, 208RR. Each work queue (i.e., send queue (SQ) 210, receive queue (RQ) 212) has an associated completion queue (CQ) 240. (Note: read queue 214 is an internal queue maintained by hardware, and is invisible to software. Therefore, no CQ 240 is associated with this queue, and the consumer does not allocate this queue nor know about its existence). It should be noted, however, that the same completion queue (CQ) 240 can be associated with more than one send queue (SQ) 210 and receive queue (RQ) 212. Association is performed at queue pair (QP) allocation time. In operation, when a consumer posts a work request WR 208 to a send queue (SQ) 210, it can specify whether it wants to get a notification when this request is completed. If the consumer requested a completion notification, RNIC 4 places a completion queue element (CQE) 242 to an associated completion queue (CQ) 240 associated with send queue (SQ) 210 upon completion of the work request (WR). The RDMA protocol defines very simple completion ordering for work requests (WR) 208 posted to a send queue (SQ) 210. In particular, RDMA send work requests (WR) 208S and RDMA write work requests (WR) 208W are completed when they have been reliably transmitted. An RDMA read work request (WR) 208R is completed when the corresponding RDMA Read Response message 206 has been received, and placed to memory region 232. Consumer work requests (WR) are completed in the order they are posted to send queue (SQ) 210. Referring to FIG. 1F, each work request (WR) posted to a receive queue (RQ) 212 also requires completion notification. Therefore, when RNIC 4 (FIG. 1A) finishes placement of a received Send message 200, it places a completion queue element (CQE) 242 to completion queue (CQ) 240 associated with that receive queue (RQ) 212.

In view of the foregoing, there is a need in the art for a way to handle aligned DDP segment placement and delivery differently than non-aligned DDP segment placement and delivery.

SUMMARY OF THE INVENTION

The invention includes an RNIC implementation that performs direct data placement to memory where all received DDP segments of a particular connection are aligned, or moves data through reassembly buffers where some DDP segments of a particular connection are non-aligned. The type of connection that cuts-through without accessing the reassembly buffers is referred to as a "Fast" connection, while the other type is referred to as a "Slow" connection. When a consumer establishes a connection, it specifies a connection type. For example, a connection that would go through the Internet to another continent has a low probability to arrive at a destination with aligned segments, and therefore should be specified by a consumer as a "Slow" connection type. On the other hand, a connection that connects two servers in a storage area network (SAN) has a very high probability to have all DDP segments aligned, and therefore would be specified by the consumer as a "Fast" connection type. The connection type can change from Fast to Slow and back. The invention reduces memory bandwidth, latency, error recovery using TCP retransmit and provides for a "graceful recovery" from an empty receive queue, i.e., a case when the receive queue does not have a posted work queue element (WQE) for an inbound untagged DDP segment. A conventional implementation would end with connection termination. In contrast, a Fast connection according to the invention would drop such a segment, and use a TCP retransmit process to recover from this situation and avoid connection termination. The implementation also may conduct cyclical redundancy checking (CRC) validation for a majority of inbound DDP segments in the Fast connection before sending a TCP acknowledgement (Ack) confirming segment reception. This allows efficient recovery using TCP reliable services from data corruption detected by a CRC check.

A first aspect of the invention is directed to a method of checking a data transfer for an error, the method comprising the steps of: assuming the data transfer includes at least one aligned direct data placement (DDP) segment; identifying a boundary of the data transfer based on an assumption that a first two bytes of a transmission control protocol (TCP) payload includes a length field of a marker with protocol data unit alignment (MPA) protocol frame; and calculating a cyclical redundancy check (CRC) value based on the assumptions.

A second aspect of the invention is directed to a system for checking a data transfer for an error, the system comprising: means for identifying a boundary of the data transfer based on a first assumption that a first two bytes of a transmission control protocol (TCP) payload includes a marker with protocol data unit alignment (MPA) protocol length field; and means for calculating a cyclical redundancy check (CRC) value based on the first assumption and a second assumption that the data transfer includes at least one aligned direct data placement (DDP) segment.

A third aspect of the invention is directed to a computer program product comprising a computer useable medium having computer readable program code embodied therein for limiting a number of re-transmission attempts for checking a data transfer for an error, the program product comprising: program code configured to identify a boundary of the data transfer based on a first assumption that a first two bytes of a transmission control protocol (TCP) payload includes a marker with protocol data unit alignment (MPA) protocol length field; and program code configured to calculate a cyclical redundancy check (CRC) value based on the first assumption and a second assumption that the data transfer includes at least one aligned direct data placement (DDP) segment.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein:

FIG. 1C shows a block diagram of possible MPA marker references for one or more DDP segments.

FIGS. 1F-1H show block diagrams of various conventional RDMA message data transfers.

DETAILED DESCRIPTION OF THE INVENTION

The following outline is provided for organizational purposes only: I. Overview, II. InLogic, III. OutLogic, and IV. Conclusion.

I. Overview

A. Environment

Figure 2A:
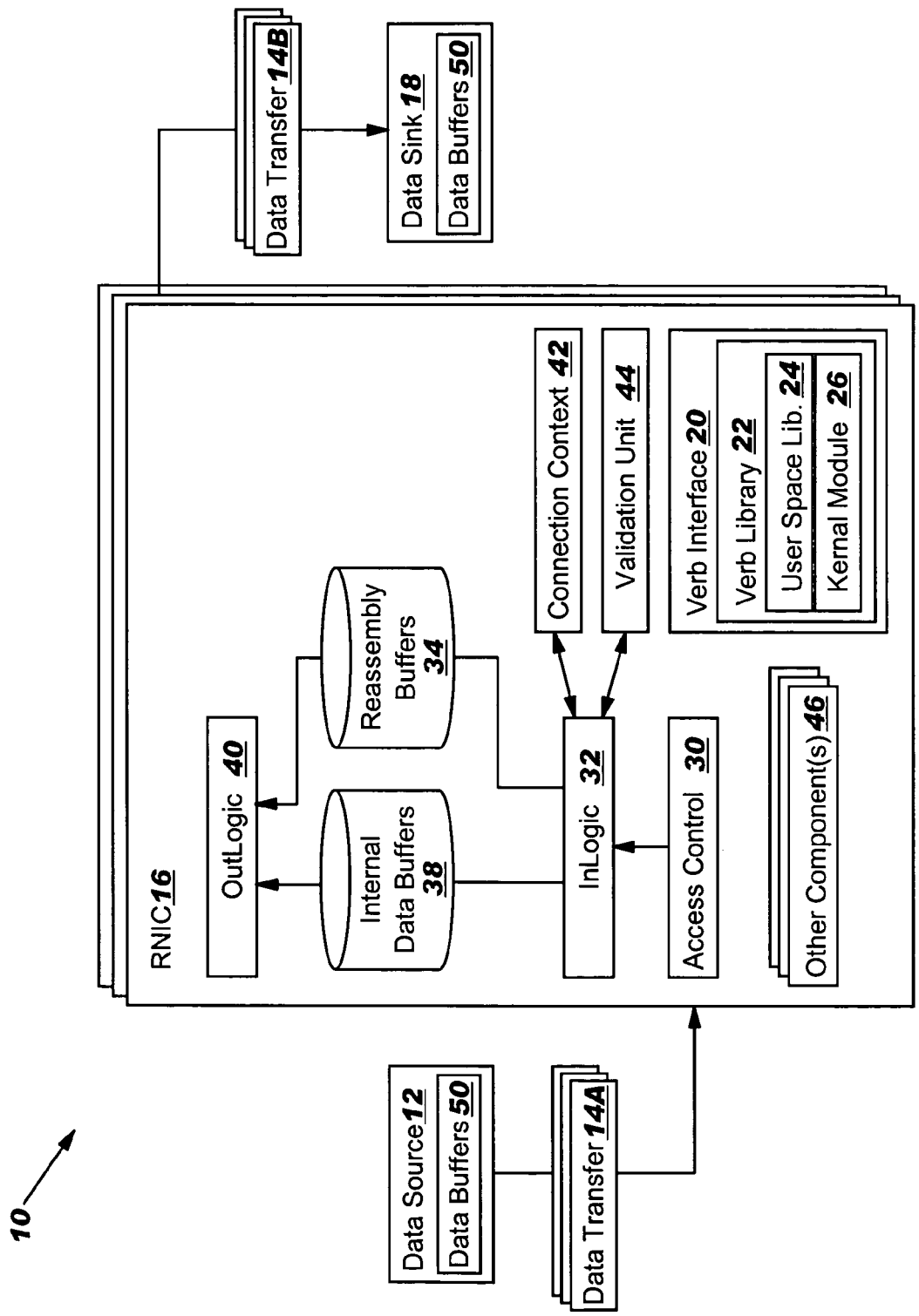
FIG. 2A shows a block diagram of a data transfer environment and RNIC according to the invention.

With reference to the accompanying drawings, FIG. 2A is a block diagram of data transfer environment 10 according to one embodiment of the invention. Data transfer environment 10 includes a data source 12 (i.e., a peer) that transmits a data transfer 14A via one or more remote memory data access (RDMA) enabled network interface controller(s) (RNIC) 16 to a data sink 18 (i.e., a peer) that receives data transfer 14B. For purposes of description, an entity that initiates a data transfer will be referred to herein as a "requester" and one that responds to the data transfer will be referred to herein as a "responder." Similarly, an entity that transmits data shall be referred to herein as a "transmitter," and one that receives a data transfer will be referred to herein as a "receiver." It should be recognized that each one of data source 12 and sink 18 may, at different times, be a transmitter or a receiver of data or a requestor or a responder, and that the labels "source" and "sink" are provided only for purposes of initially denoting that entity which holds the data to be transferred. The following description may also refer to one of the above entities as a "consumer" (for its consuming of RNIC 16 resources), where a more specific label is not necessary. "Destination buffers" shall refer to the data storage that ultimately receives the data at a receiver, i.e., data buffers 50 of data source 12 or data sink 18. Data source 12 and data sink 18 each include data buffers 50 for storage of data.

In terms of hardware, RNIC 16 is any network interface controller such as a network I/O adapter or embedded controller with iWARP and verbs functionality. RNIC 16 also includes a verb interface 20, an access control 30, RNIC input logic (hereinafter "InLogic") 32, reassembly buffers 34, an internal data buffer 38, RNIC output logic (hereinafter "OutLogic") 40, a connection context 42, a validation unit 44 and other components 46. Verb interface 20 is the presentation of RNIC 16 to a consumer as implemented through the combination of RNIC 16 hardware and an RNIC driver (not shown) to perform operations. Verb interface 20 includes a verb library 22 having two parts: a user space library 24 and a kernel module 26. Access control 30 may include any now known or later developed logic for controlling access to InLogic 32. Reassembly buffers 34 may include any mechanism for temporary storage of data relative to a data transfer 14A, 14B. In particular, reassembly buffers 34 are commonly used for temporary storage of out-of-order TCP streams, as will be described in greater detail below. Other components 46 may include any other logic, hardware, software, etc., necessary for operation of RNIC 16, but not otherwise described herein.

Figure 2C:
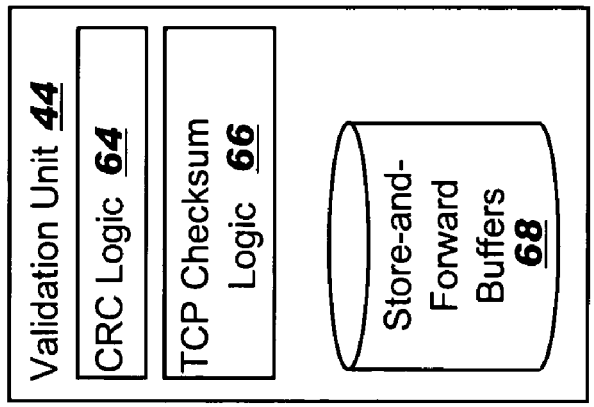
FIG. 2C shows a block diagram of a validation unit of the RNIC of FIG. 2A.
Figure 2B:
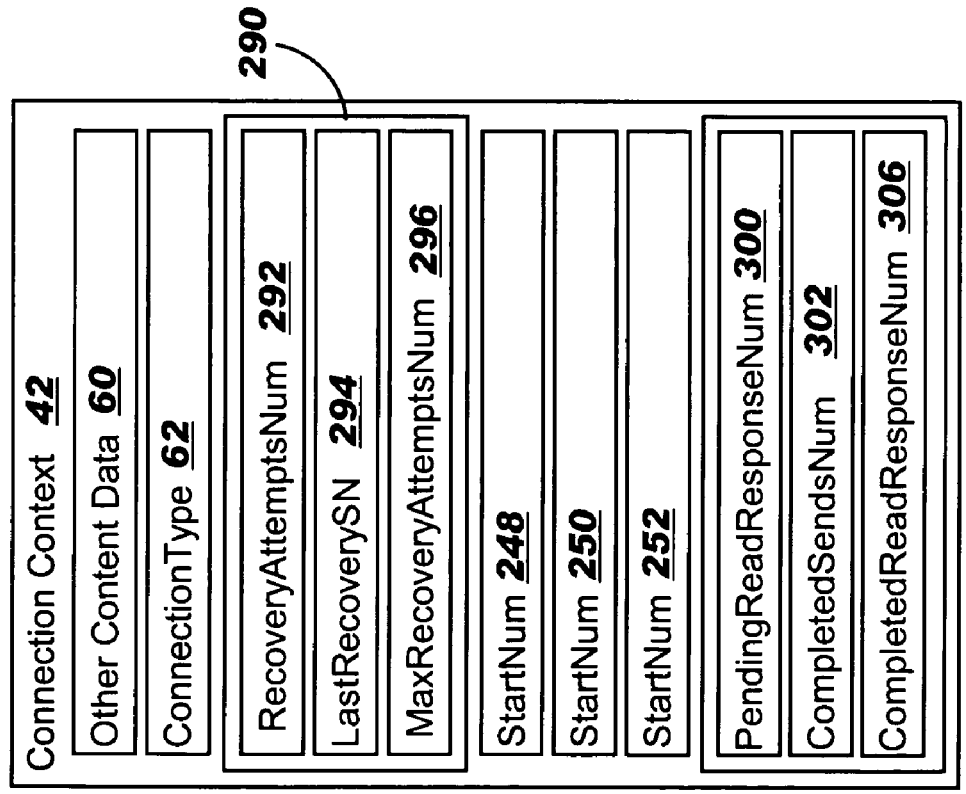
FIG. 2B shows a block diagram of a connection context of the RNIC of FIG. 2A.

Referring to FIG. 2B, connection context 42 includes a number of fields for storing connection-specific data. Other context data 60 provides connection-specific data not otherwise explained herein but recognizable to one having ordinary skill in the art. In accordance with the invention, two connection types are defined: a Fast (hereinafter "FAST") connection and a Slow (hereinafter "SLOW") connection. The terms "Fast" and "Slow" refer to the connection's likelihood of delivering aligned DDP segments. The connection type is identified in a connection context field called ConnectionType 62. The SLOW connection may be used for RDMA connections which either were created as SLOW connections, or were downgraded by RNIC 16 during processing of inbound data, as will be described in greater detail below. Other fields shown in FIG. 2B will be described relative to their associated processing elsewhere in this disclosure. Referring to FIG. 2C, validation unit 44 includes cyclic redundancy checking (CRC) logic 64, TCP checksum logic 66 and store-and-forward buffers 68 as may be necessary for validation processing.

B. RNIC General Operation

Returning to FIG. 2A, in operation, RNIC 16 receives data transfer 14A via an access control 30 that controls access to InLogic 32. Information for sustaining the connection is retained in other context data 60 (FIG. 2B) of connection context 42, as is conventional. InLogic 32 processes inbound TCP segments in data transfer 14A, performs validation of received TCP segments via TCP checksum logic 66 (FIG. 2C), calculates MPA CRC via CRC logic 64 (FIG. 2C), and separates FAST connection data streams from SLOW connection data streams. With regard to the latter function, InLogic 32, as will be described more fully below, directs all data received by RNIC 16 on a SLOW connection to reassembly buffers 34, and handles a FAST connection in a number of different ways. With regard to the FAST connections, if InLogic 32 detects an alignment violation (i.e., a TCP header is not immediately followed by a DDP Header, and the DDP segment is not fully contained in the one TCP segment), the connection is downgraded to a SLOW connection and data is directed to reassembly buffers 34. In contrast, if an alignment violation is not present, InLogic 32 directs the aligned inbound DDP stream to an internal data buffer 38 and then to OutLogic 40 for direct placement to a destination data buffer 50. Alternatively, a TCP segment 106 may be dropped, and no acknowledgement (Ack) sent, thus necessitating a re-transmission of the segment.

OutLogic 40 arbitrates between FAST and SLOW connections, and performs data placement of both connection type streams to data sink 18 data buffers 50. The situation in which aligned DDP segments on a FAST connection are directed to internal data buffer 38 for direct placement to a destination buffer is referred to as the "cut-through mode" since FAST connections having aligned DDP segments are placed directly by OutLogic 40, bypassing reassembly buffer 34. For both connection types, however, only an in-order received data stream is delivered to data sink 18 via OutLogic 40.

II. InLogic

Figure 3:
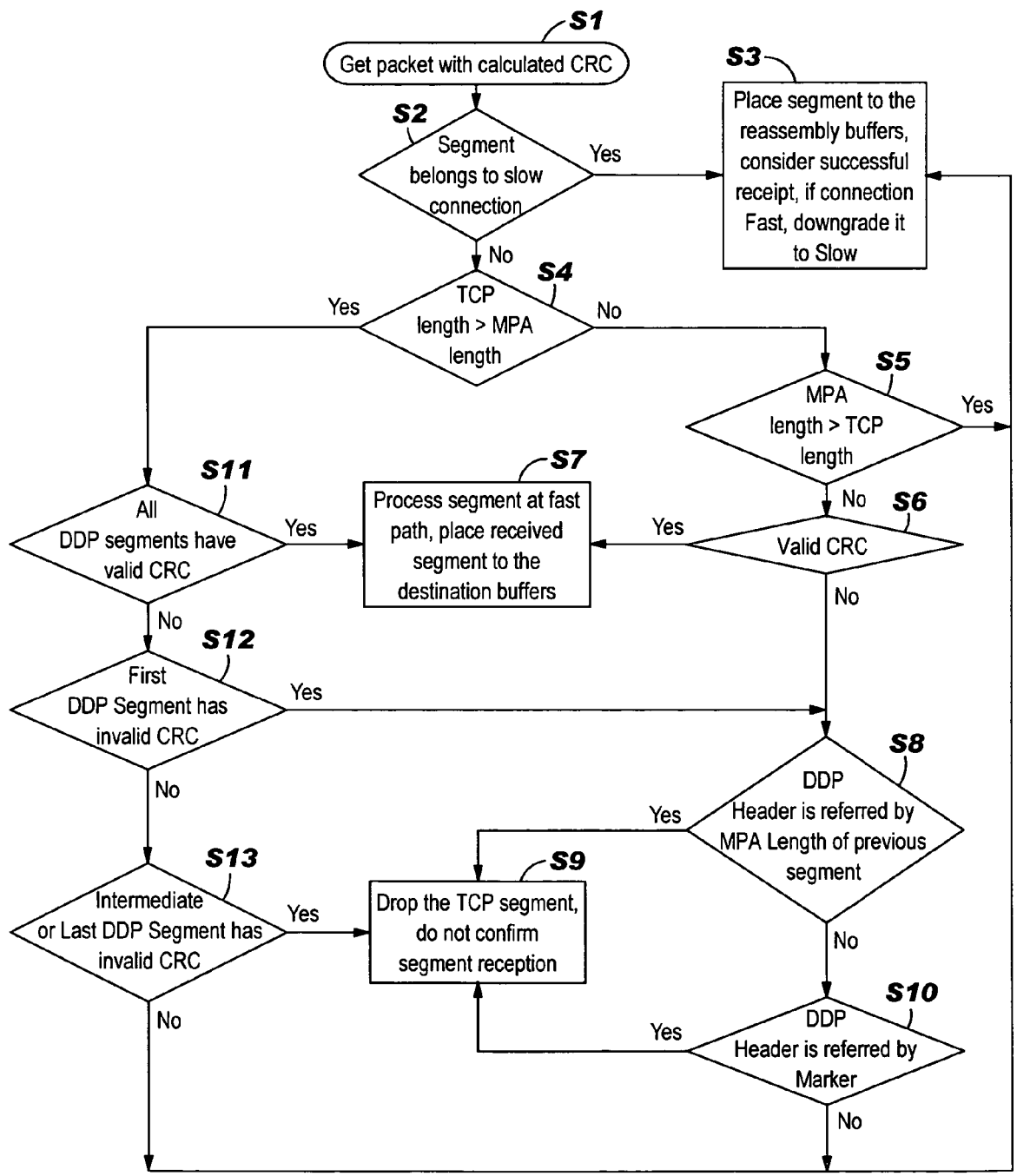
FIG. 3 shows a flow diagram of RNIC input logic (i.e., InLogic) functions.

With reference to FIG. 3, a flow diagram of InLogic 32 (FIG. 2A) according to the invention and its processing of a data transfer 14A will be described in further detail. As noted above, InLogic 32 processes inbound TCP segments, performs TCP validation of received segments, calculates MPA CRC, and separates FAST connection data streams from SLOW connection data streams. Unless otherwise noted, reference numerals not followed by an "S" refer to structure shown in FIGS. 2A-2C.

In a first step S1, InLogic 32 filters TCP segments 106 of a data transfer 14A belonging to RNIC 16 connections, and obtains packets with calculated CRC validation (via validation unit 44) results for the received segments. (Note that CRC validation should be done before InLogic 32 decision processing. CRC validation can also be done simultaneously with TCP checksum calculation, before TCP segment 106 is identified as one belonging to a FAST connection—step S2.)

In step S2, InLogic 32 determines whether TCP segment 106 belongs to a SLOW connection. In this case, InLogic 32 determines how the transmitter labeled the connection. If YES, TCP segment 106 is directed to reassembly buffers 34, and TCP logic considers this segment as successfully received, at step S3.

If NO, InLogic 32 proceeds, at step S4, to determine whether TCP segment 106 length is greater than a stated MPA segment length. That is, whether TCP segment 106 length, which is stated in TCP header 126, is longer than an MPA length stated in MPA length field 114. If YES, this indicates that TCP segment 106 includes multiple DDP segments 112, the processing of which will be described below. If NO, this indicates that TCP segment 106 includes a single DDP segment 112 or 112NA.

In this latter case, at step S5, InLogic 32 determines whether the MPA length is greater than TCP segment 106 length. If YES, this indicates one of three situations: 1) the single DDP segment 112NA is not aligned to TCP segment 106, and the field that was assumed to be an MPA length field is not a length field; 2) the beginning of the single DDP segment 112 is aligned to TCP segment 106, but the length of the single DDP segment exceeds TCP segment 106 payload size; or 3) the received single DDP segment 112 is aligned to TCP segment 106, but has a corrupted MPA length field 114. The first two cases (1 and 2) indicate that the non-aligned single DDP segment 112NA has been received on a FAST connection, and thus the connection should be downgraded to a SLOW connection, at step S3. The third case (3) does not require connection downgrade. However, since the reason for MPA frame 109 length exceeding TCP segment 106 length cannot be identified and confirmed, the drop (i.e., cancellation and non-transfer) of such TCP segment 106 is not advisable because it can lead to a deadlock (case 2, above). That is, if such TCP segment indeed carried a non-aligned DDP segment, the transmitter will retransmit the same non-aligned DDP segment, which following the same flow, would be repeatedly dropped by the receiver leading to a deadlock. Accordingly, InLogic 32, at step S3, directs data transfer of TCP segment 106 to reassembly buffers 34, schedules an Ack to confirm that TCP segment 106 was successfully received, and downgrades the connection to a SLOW connection (i.e., ConnectionType field 62 in FIG. 2B is switched from Fast to Slow). As will be described below, if MPA length field 114 is corrupted (case 3 above), this is detected by OutLogic 40, and the connection would be closed due to a CRC error as detected by validation unit 44. Therefore, the connection downgrade, at step S3, would not cause the FAST connection to permanently become a SLOW connection due to data corruption in an aligned DDP segment 112.

Returning to step S5, if MPA length is not greater than TCP length, i.e., NO, this indicates that MPA frame 109 length matches (equals) TCP segment 106 length. InLogic 32 proceeds, at step S6, to determine whether the CRC validation results are valid for this TCP segment 106. That is, whether CRC logic 64 returned a "valid" indication. If YES, this indicates that single DDP segment 112 exactly fits TCP segment 106 boundaries (i.e., lengths are equal to one another), and no data corruption has been detected for this segment. As a result, at step S7, single DDP segment 112 is processed in a "fast path mode" by placing the received TCP segment 106 to internal data buffer 38 of RNIC 16 for processing by OutLogic 40, which places the received TCP segment 106 directly to the destination data buffers 50 of a receiver, e.g., of data sink 18. In addition, an Ack is scheduled to confirm successful reception of this TCP segment 106.

Figure 1A:
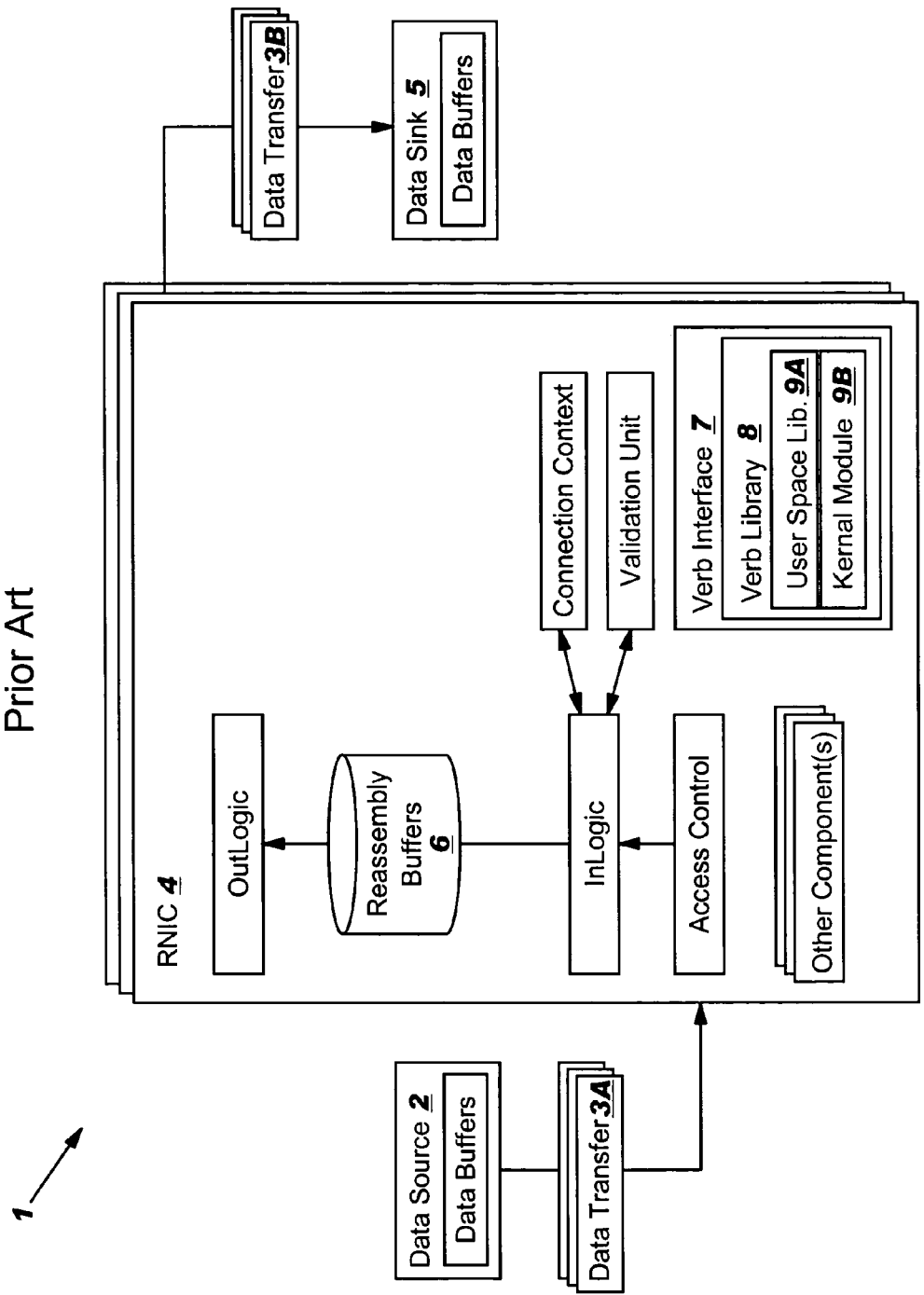
FIG. 1A shows a block diagram of a conventional data transfer environment and RNIC.

If CRC logic 64 returns an "invalid" indication, i.e, NO at step S6, this indicates one of five possible cases exist that can be determined according to the invention. FIG. 1C illustrates the five possible cases and steps S8-S10 illustrate how InLogic 32 handles each case. In any case, the object of processing is to: 1) avoid termination of non-aligned connections, even if those were declared by a transmitter to be a FAST connection; 2) reduce probability of connection termination due to data corruption in aligned DDP segments belonging to a FAST connection; and 3) maintain InLogic 32 as simple as possible while reducing the number of cases to be treated separately to a minimum.

At step S8, InLogic 32 determines, as shown as Case A in FIG. 1C, whether a DDP segment header 160 of a newly received DDP segment 162 is referenced by an MPA length field 164 of a previously processed DDP segment 166. In this case, the MPA length of previously processed DDP segment 166 was checked during validation of MPA CRC of newly received DDP segment 162, and thus refers to the correct location of DDP header 160 in the next segment. CRC invalidation for Case A, at step S6, means that the single DDP segment 162 data or header 160 has been corrupted. TCP retransmit of newly received segment 162 resolves this problem. Accordingly, at step S9, TCP segment 106 is dropped, and segment reception is considered not confirmed.

If newly received DDP segment 162 header 160 is not referenced by MPA length field 164 of previously processed DDP segment 166 (i.e., NO at step S8), InLogic 32 proceeds, at step S10, to determine, as shown as Case B in FIG. 1C, whether newly received DDP segment 162 header 160 is referenced by a marker 168 located inside newly received DDP segment 162. That is, marker 168 is referring to the beginning of newly received DDP segment 162. In this case, CRC invalidation, at step S6, indicates that either: 1) marker 168 carries a correct value, and newly received DDP segment 162 has a corrupted DDP header 160 or data, or 2) marker 168 inside newly received DDP segment 162 has been corrupted. In both cases retransmit of newly received DDP segment 162 resolves the problem. Accordingly, at step S9, the TCP segment is dropped, and segment reception is not confirmed.

If newly received DDP segment 162 header 160 is not referenced by a marker 168 located inside newly received DDP segment 162, i.e., NO at step S10, then one of three cases exist. First, as shown as Case C in FIG. 1C, marker 168 is located in newly received DDP segment 162, but points outside of the segment. Second, as shown as Case D in FIG. 1C, marker 168 is located in newly received DDP segment 162, but points inside the segment. Third, as shown as Case E in FIG. 1C, no marker is located in newly received DDP segment 162.

Figure 1B:
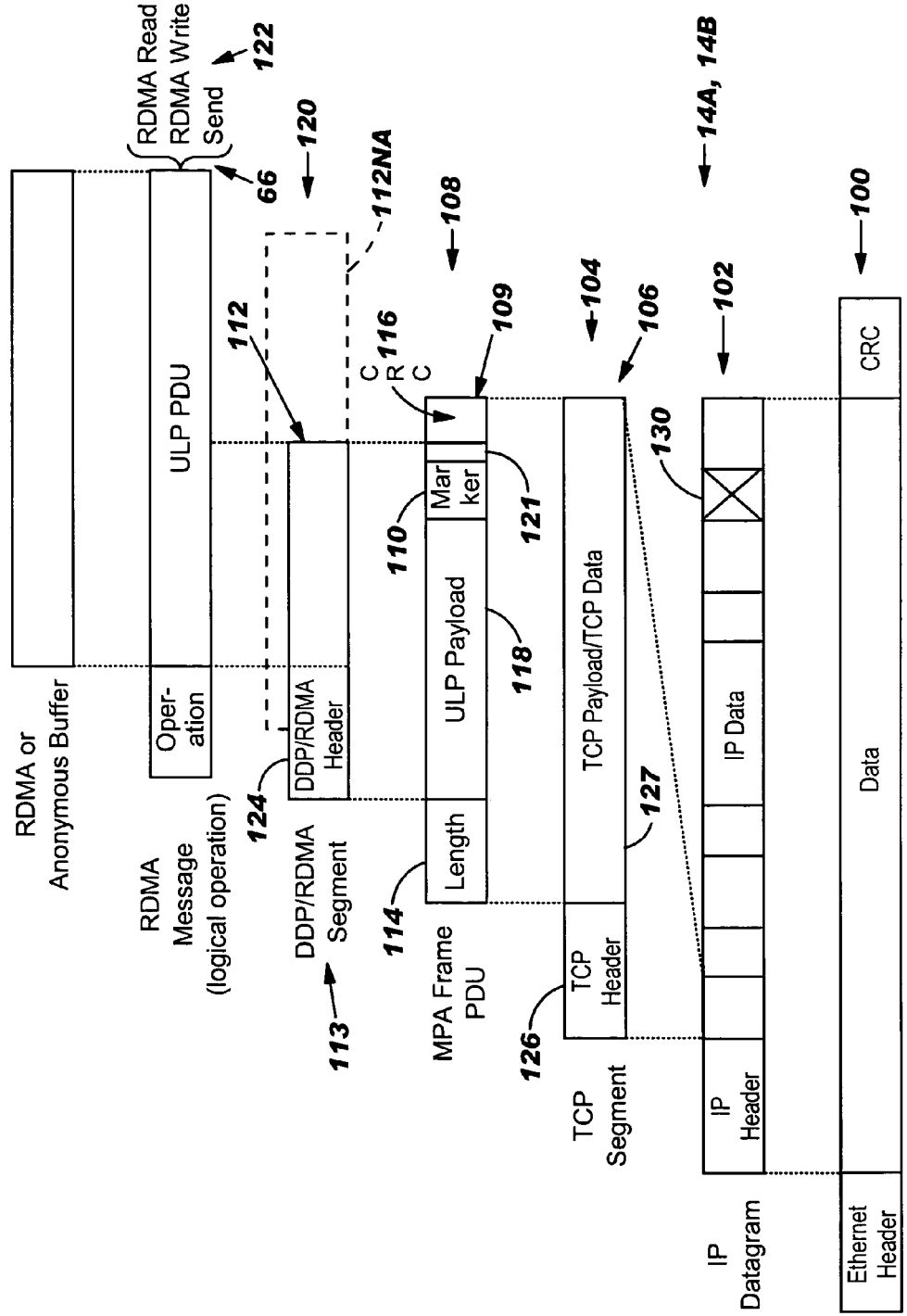
FIG. 1B shows a block diagram of conventional MPA/RDMA/DDP over TCP/IP data transfer structure.

In Cases C, D and E, the reason for CRC logic 64 returning an invalid indication is uncertain and can be the result of data corruption and/or reception of a non-aligned DDP segment 112NA (FIG. 1B). Unlimited retransmit of such a segment can lead to deadlock in the case of a non-aligned DDP segment 112NA. To avoid potential deadlock, InLogic 32 handles Cases C, D and E by, as shown at step S3, directing newly received DDP segment 162 to reassembly buffers 34, scheduling an Ack to confirm successful reception of the segment, and downgrading the connection to a SLOW connection. If CRC logic 64 returning an invalid indication was due to data corruption in an aligned DDP segment 112, this error would be detected by OutLogic 40, as will be described below, when processing the data of the SLOW connection and the connection would be terminated. Otherwise, the connection will remain a SLOW connection forever. However, a Limited Retransmission Attempt Mode, as will be described below, may prevent this problem.

Returning to step S4 of FIG. 3, if InLogic 32 determines that TCP segment 106 length is greater than MPA frame 109 length this indicates that TCP segment 106 includes multiple DDP segments 112. In this case, at step S11, a sequential checking of CRC logic 64 validation results is conducted from a first to a last DDP segment 112. If all DDP segments 112 have a valid CRC, i.e., YES, all DDP segments 112 are fully contained in TCP segment 106, and all are valid, properly aligned DDP segments 112. In this case, InLogic 32 processes DDP segments 112, at step S7, on the fast path mode by placing the received TCP segment 106 to internal data buffer 38 of RNIC 16 for processing by OutLogic 40, which places the received TCP segment 106 to the destination data buffers, e.g., data buffers 50 of data sink 18. In addition, an Ack is scheduled to confirm successful reception of this TCP segment 106. InLogic 32 stops checking CRC validation results when a first failure has been detected, the management of which is explained relative to steps S12-S13.

In step S12, InLogic 32 determines whether a first DDP segment 112 has an invalid CRC as determined by CRC logic 64. If YES, InLogic 32 processes the first DDP segment 112 similarly to an invalid CRC case for a single DDP segment (step S8). That is, InLogic 32 treats the first DDP segment 112 with an invalid CRC as a single DDP segment 112 and proceeds to determine what caused the CRC invalidation, i.e., which of Cases A-E of FIG. 1C applies, and how to appropriately handle the case.

If step S12 results in NO, i.e., the first DDP segment 112 has a valid CRC, then InLogic 32 proceeds to determine whether CRC invalidity has been detected when checking an intermediate or last DDP segment 112 at step S13. If YES, InLogic 32 (FIG. 1) proceeds to step S9, since this error indicates that the data or header of DDP segment 112 that caused the CRC invalidation has been corrupted (i.e., length of previous DDP segment with valid CRC). That is, the CRC error was detected on the intermediate or last DDP segment 112 in the same TCP segment 106, which means the preceding DDP segment has a valid CRC, and thus the length of the preceding DDP segment points to the header of the segment with the invalid CRC. This matches the description of Case A (FIG. 1C). Therefore, as described in Case A, the location of the header is known, and therefore, the CRC error is known to have been caused either by data or header corruption. Accordingly, a retransmit of the entire TCP segment should resolve this problem, without any risk of the deadlock scenario. At step S9, the TCP segment is dropped, and segment reception is not confirmed.

If step S13 results in NO, i.e., an intermediate or last DDP segment 112 has not caused the CRC invalidation, then this indicates that MPA length field 114 of the last DDP segment 112 exceeds TCP segment 106 boundaries, i.e., the last DDP segment is outside of TCP segment 106 boundaries or is too long. In this case, InLogic 32 treats the situation identical to the single DDP segment 112 that is too long. In particular, InLogic 32 proceeds to, at step S3, direct data transfer 14A of TCP segment 106 to reassembly buffers 34, schedules an Ack to confirm that TCP segment 106 was successfully received, and downgrades the connection to a SLOW connection. In this way, deadlock is avoided. If RNIC 16 decides to drop one of the multiple DDP segments 112 contained in a TCP segment 106, the entire TCP segment 106 is dropped, which simplifies implementation and reduces the number of cases that need to be handled.

Although not discussed explicitly above, it should be recognized that other data transfer processing may also be carried in conjunction with the above described operation of InLogic 32. For example, filtering of TCP segments belonging to RNIC 16 connections and TCP/IP validations of received segments may also be performed including checksum validation via TCP checksum logic 66 (FIG. 2C). Processing of inbound TCP segment 106 may also include calculation of MPA CRC, and validation of this CRC via CRC logic 64 (FIG. 2C). One particular embodiment for CRC calculation and validation will be further described below.

A. Limited Retransmission Attempt Mode

As an alternative embodiment relative to the uncertainty of the cause of a detected error (e.g., NO at step S10 of FIG. 3 being one illustrative determination that may result in such a situation), a "limited retransmission attempt mode" may be implemented to limit the number of retransmit attempts to avoid deadlock and reduce the number of FAST connections that are needlessly reduced to SLOW connections. In particular, as noted above, Cases C, D and E represent several cases in which, due to uncertainty of the cause of a detected error, the connection may be downgraded to a SLOW connection (step S3) with potential connection termination (by OutLogic 40) when the error was caused by data corruption and not loss of DDP segment 112 alignment.

In order to limit the number of retransmit attempts, the present invention provides additional fields to connection context 42 (FIG. 2B) to allow for a certain number of retransmissions before downgrading the connection. In particular, as shown in FIG. 2B, connection context 42 includes a set of fields 290 including: a number of recovery attempts field (RecoveryAttemptsNum) 292, a last recovery sequence number field (LastRecoverySN) 294 and a maximum recovery attempts number field (MaxRecoveryAttemptsNum) 296. RecoveryAttemptsNum field 292 maintains the number of recovery attempts that were done for the connection since the last update; LastRecoverySN field 294 maintains a sequence number (SN) of the last initiated recovery operation; and MaxRecoveryAttemptsNum field 296 defines the maximum number of recovery attempts that should be performed by InLogic 32 before downgrading the connection.

Figure 4A:
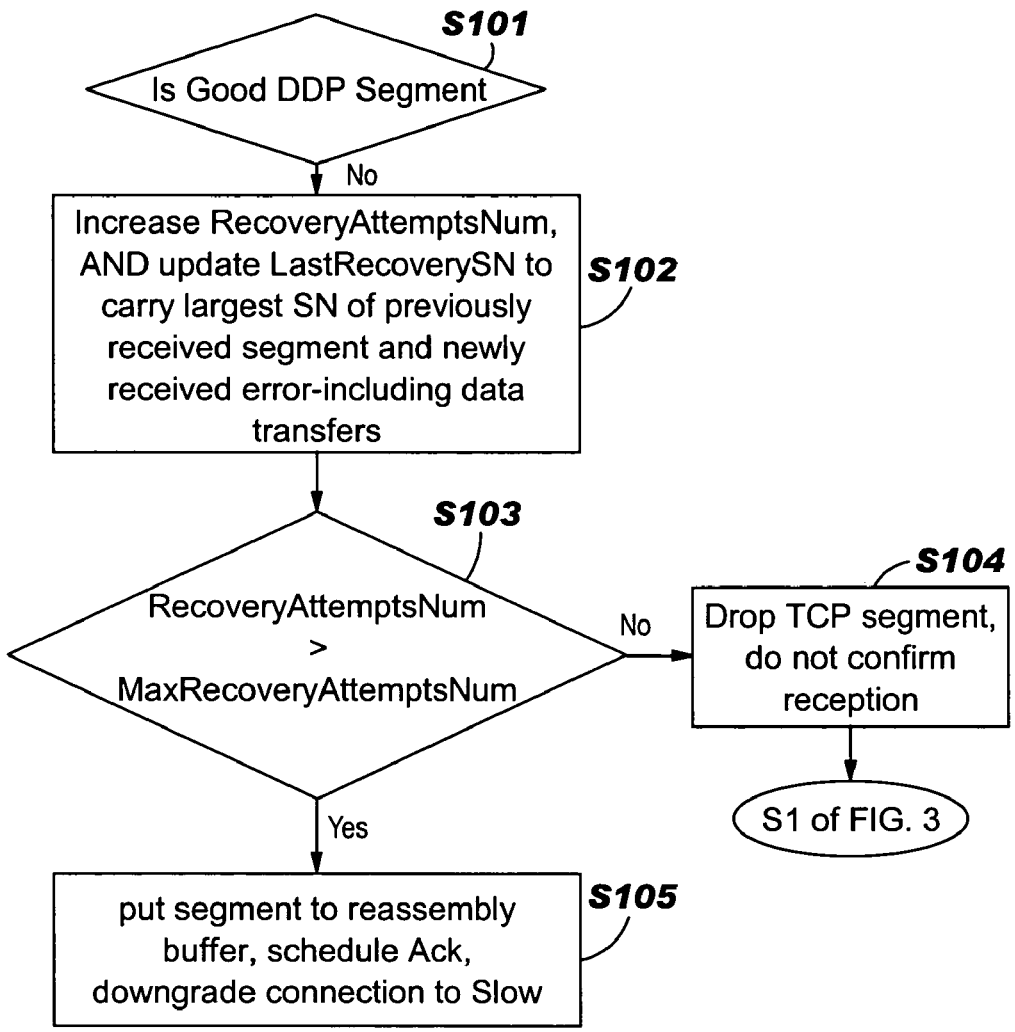
FIGS. 4A-4B show flow diagrams for a limited retransmission attempt mode embodiment for the in Logic of FIG. 3.

Referring to FIG. 4A, in operation, when InLogic 32 detects that a new in-order received data transfer includes an error (shown generically as step S101 in FIG. 4A), rather than immediately downgrade the connection to a SLOW connection (at step S3 in FIG. 3), InLogic 32 provides for a certain number of retransmits to be conducted for that error-including data transfer. It should be recognized that step S101 is generic for a number of error determinations (step S101 may apply, e.g., for a YES at step S5 of FIG. 3 or a NO at step S10 of FIG. 3) that are caused either by a non-aligned DDP segment 112NA or a data corruption. At step S102, InLogic proceeds to record this transmission attempt for this error-including data transfer, step S102, by increasing RecoveryAttemptsNum by one (1). In addition, InLogic updates LastRecoverySN to store the largest sequence number between the previously stored sequence number therein and that of the newly received (but dropped) data transfer. That is, InLogic updates LastRecoverySN to store the largest sequence number among at least one previously received error-including data transfer and the newly received error-including (but dropped) data transfer. The newly received error-including data transfer is determined to have a sequence number greater than the largest sequence number by comparing the sequence number of the newly received error-including data transfer to the stored largest sequence number. The significance of LastRecoverySN recordation will become apparent below.

Next, at step S103, InLogic 32 determines whether the RecoveryAttemptsNum (field 292) exceeds the MaxRecoveryAttemptsNum (field 296). If NO, at step S104, InLogic 32 drops TCP segment 106 and does not confirm successful receipt, which causes a retransmission of the TCP segment. Processing then returns to step S1 (FIG. 3). If TCP segment 106 was corrupted, then the retransmission should remedy the corruption such that data transfer 14A is placed directly to memory as a FAST connection (at step S7 of FIG. 3). Alternatively, if processing continues to return other error detections (e.g., step S10 of FIG. 3), RecoveryAttemptsNum (field 292) will eventually exceed MaxRecoveryAttemptsNum (field 296) and result in a YES at step S106. In this case, InLogic 32 proceeds to step S105 at which InLogic 32 downgrades the connection to a SLOW connection, places error-including data transfer 14A to reassembly buffer 34 and schedules an Ack confirming successful reception of this TCP segment. The above process occurs for each error-including data transfer.

Figure 4B:
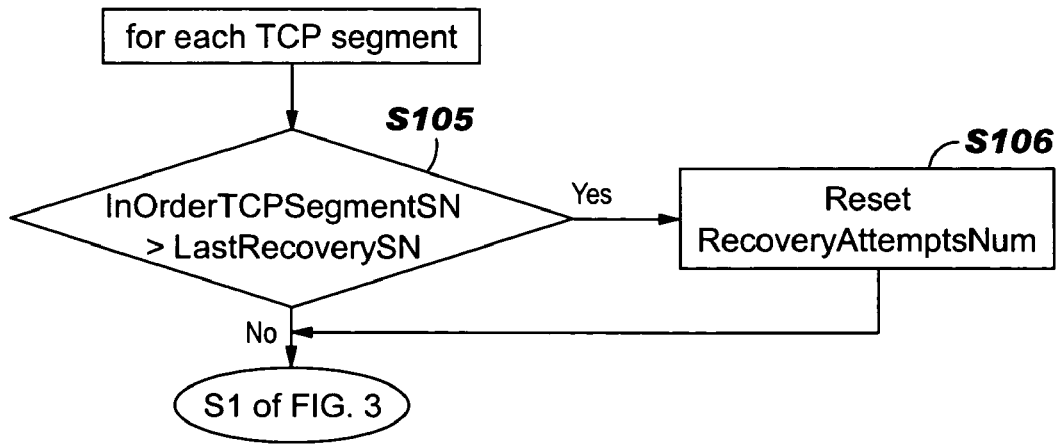

FIG. 4B represents another component of the Limited Retransmission Attempt Mode that addresses the fact that data corruption usually does not occur in multiple consecutive TCP segments, but non-aligned segments may affect several subsequent TCP segments. For example, a FAST connection may be sustained for a long period of time, e.g., five hours, and from time-to-time, e.g., once an hour, may have data corruption such that CRC validation will fail. As this occurs, the RecoveryAttemptsNum (field 292) may be increased each time the error-including data transfer (i.e., corrupted segment) is dropped. This process addresses the situation where different segments are dropped due to data corruption at different periods of time, and after several (probably one) retransmit operation these segments are successfully received, and placed to the memory. Accordingly, the recovery operation for these segments was successfully completed, and the data corruption cases that are recovered from are not counted, i.e., when entering a new recovery mode due to reception of new errant segment.

In order to exit from the limited retransmission attempt mode, a determination as to whether a TCP segment Sequence Number (SN) of a newly received in-order data transfer (i.e., InOrderTCPSegmentSN) is greater than a LastRecovery Sequence Number (SN) (field 294 in FIG. 2B) is made at step S105. That is, a sequence number of each newly received in-order TCP segment belonging to a FAST connection is compared to a stored largest sequence number selected from the one or more previously received error-including data transfers. (Note that reception of an out-of-order segment with larger SN does not mean that error recovery was completed.) However, one indicator that recovery is complete is that a TCP segment is received that was transmitted after the segment(s) that caused entry to the recovery mode. This situation can be determined by comparing the InOrderTCPSegmentSN with LastRecoverySN. This determination can be made at practically any stage of processing of the TCP segment received for this connection. For example, after step S9 in FIG. 3, or prior to step S102 in FIG. 4A. When the in-order segment SN is greater than the LastRecoverySN, i.e., a new TCP segment is received, and YES is determined at step S105, at step S106, RecoveryAttemptsNum (field 292 in FIG. 2B) is reset, i.e., set to zero. Relative to the above example, step S105 prevents unnecessary downgrading of a FAST connection to a SLOW connection after the long period of time, e.g., five hours (i.e., because RecoveryAttemptsNum exceeds MaxRecoveryAttemptsNum), where the dropped segments were dropped due to data corruption and then, after the transmitter retransmitted the segment, were successfully received and processed as an aligned segment. If NO at step S105 or after step S106, segment processing proceeds as usual, e.g., step S1 of FIG. 3.

Using the above processing, the number of retransmits allowed can be user defined by setting MaxRecoveryAttemptsNum field 296. It should be recognized that while the limited retransmission attempt mode has been described above relative to FIGS. 4A-4B and an error detection relative to step S10 of FIG. 3, the limited retransmission attempt mode is applicable beyond just the error detection of step S10, as will be described further below. Note, that the limited retransmission attempt mode also finds advantageous use with part D, Speeding Up TCP Retransmit Process, described below, which sends an immediate Duplicate Ack when a segment was dropped due to ULP considerations.

B. Connection Downgrading

Figure 5:
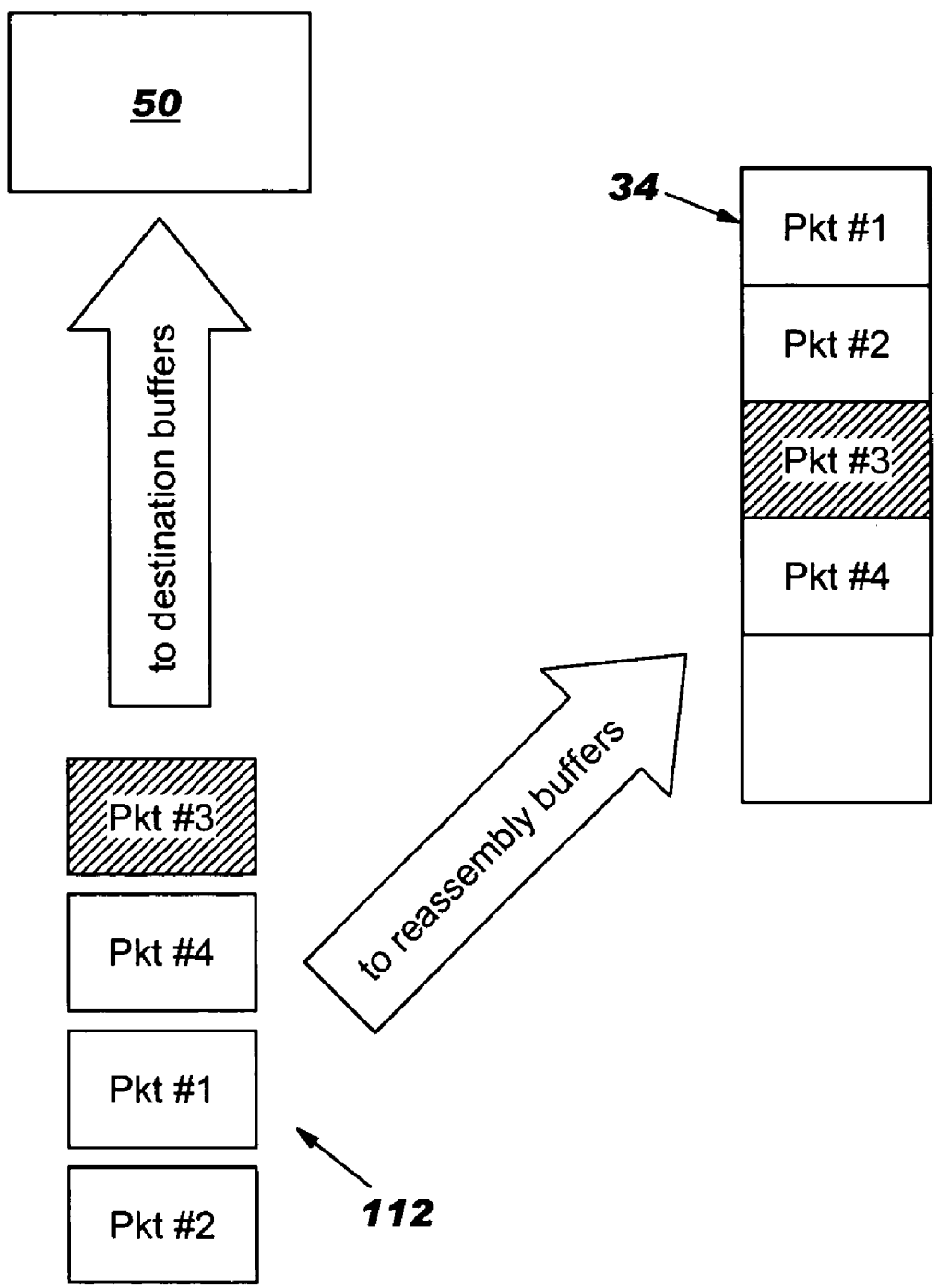
FIG. 5 shows a block diagram illustrating handling of TCP segments after connection downgrading according to an alternative embodiment.

Referring to FIG. 5, discussion of handling of a unique situation in which a connection is downgraded (step S3 in FIG. 3) after one or more out-of-order received DDP segments 112 are placed to destination data buffers 50 in the fast path mode will now be described. As shown in FIG. 5, four TCP segments labeled packet (Pkt) are received out-of-order, i.e., in the order 3, 4, 1 and 2. When a connection is downgraded to a SLOW connection, all data received from the moment of downgrading is placed to reassembly buffers 34 and is reassembled to be in-order, i.e., as Pkts 1, 2, 3 and 4. In this case, according to the TCP protocol, InLogic 32 maintains records that those segments were received.

Although rare, a situation may arise where a segment(s), e.g., Pkt #3 (shaded), is/are directly placed to destination data buffers 50. This situation leads to the location in reassembly buffers 34 that would normally hold packet 3 (Pkt# 3) being filled with 'garbage' data, i.e., gaps or holes, even though InLogic 32 assumes that all data was received. If processing is allowed to continue uncorrected, when OutLogic 40 transfers reassembly buffers 34 to destination data buffers 50, packet 3 (Pkt #3) that was earlier transferred on the fast path mode will be overwritten with the 'garbage' data, which will corrupt the data.

To resolve this problem without adding hardware complexity, in an alternative embodiment, InLogic 32 directs TCP logic to forget about the segments that were out-of-order received when the connection was a FAST connection (i.e., Pkt# 3 in FIG. 5). In particular, InLogic 32 is configured to clear a TCP hole for an out-of-order placed data transfer when downgrading the connection to a SLOW connection at step S3 (FIG. 3), and stops receipt reporting to the transmitter that these packets have been received (SACK option). As a result, a transmitter retransmits all not acknowledged data, including those segment(s) that were out-of-order directly placed to destination data buffers 50, i.e., Pkt# 3. When the retransmitted data is received, it is written to reassembly buffers 34, and any out-of-order directly placed segments are overwritten at destination data buffers 50 when OutLogic 40 transfers the data from reassembly buffers 34. This functionality effectively means that RNIC 16 'drops' segments that were out-of-order placed to destination data buffers 50 in this connection. Such approach eliminates the case of 'gapped' in-order streams in reassembly buffers 34, and does not cause visible performance degradation because of the rare conditions that would lead to such behavior.

C. Connection Upgrade

Figure 6:
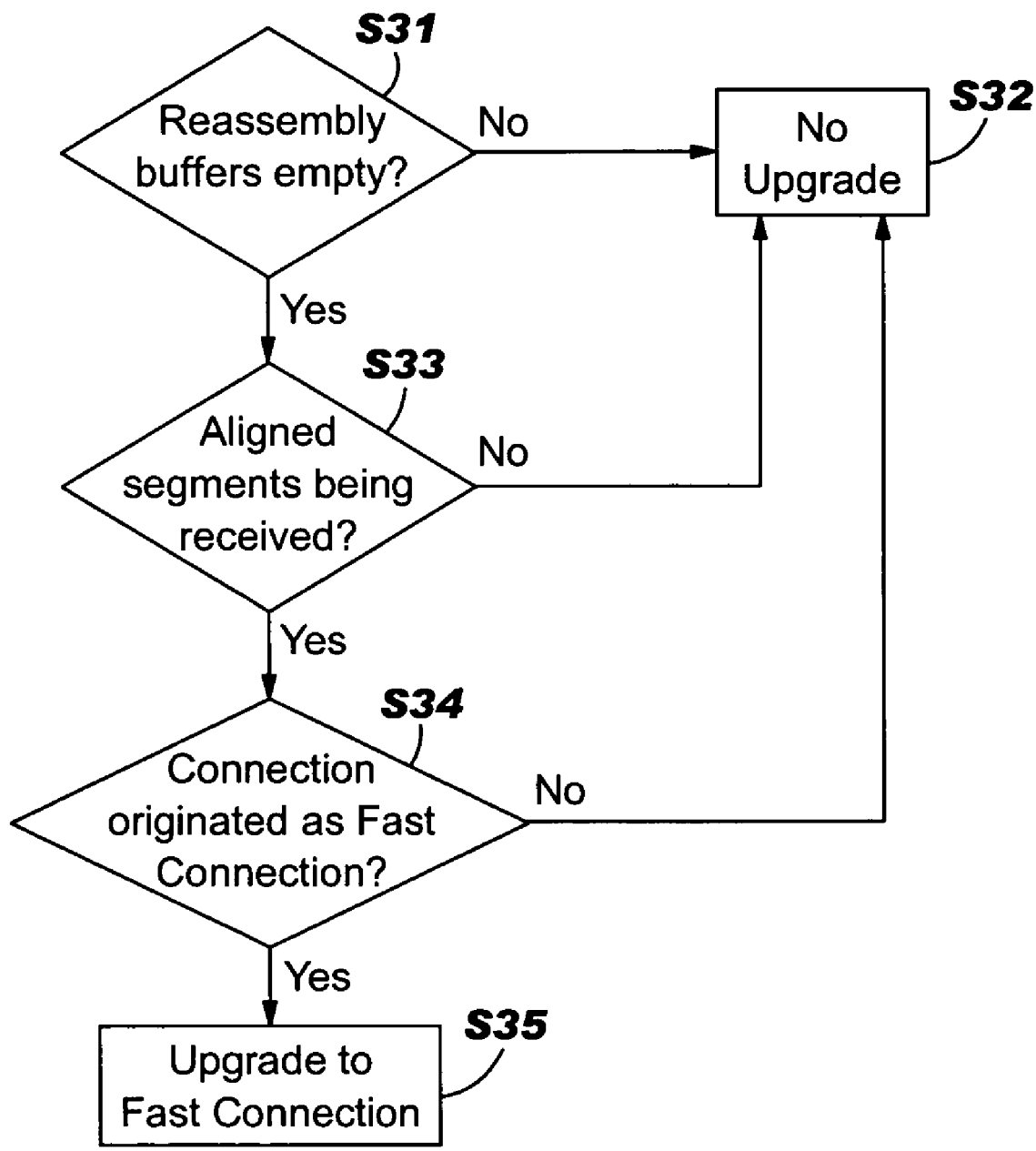
FIG. 6 shows a flow diagram for a connection upgrade embodiment for the InLogic of FIG. 3.

As another alternative embodiment, the present invention may include a connection upgrade procedure as illustrated in FIG. 6. The purpose of the fast path mode approach described above is to allow bypassing of reassembly buffers 34 for a connection carrying aligned DDP segments 112. However, even in FAST connections, a data source 12 or intermediate network device can generate intermittent non-aligned DDP segments 112NA, which causes FAST connections to be downgraded to SLOW connections according to the above-described techniques. The intermittent behavior can be caused, for example, by maximum segment size (MSS) changes during TCP retransmit, or other sporadic scenarios.

As shown in FIG. 6, to recover from this situation, the present invention may also provide a connection upgrade from a SLOW connection to a FAST connection after an earlier downgrade, e.g., at step S3 (FIG. 3). In order to accommodate the upgrade, a number of situations must be present. In a first step S31 of the alternative embodiment, InLogic 32 determines whether reassembly buffers 34 are empty. If NO, then no upgrade occurs—step S32. If YES is determined at step S31, then at step S33, InLogic 32 determines whether aligned DDP segments 112 are being received. If NO, then no upgrade occurs—step S32. If YES is determined at step S33, then at step S34, InLogic 32 determines whether the connection was originated as a FAST connection by a transmitter, e.g., data source 12. If NO is determined at step S24, then no upgrade occurs—step S32. If YES is determined at step S34, the connection is upgraded to a FAST connection at step S35.

D. Speeding Up TCP Retransmit Process

Another alternative embodiment addresses the situation in which a TCP segment 106 is received, but is dropped because of RDMA or ULP considerations, e.g., corruption, invalid CRC of DDP segments, etc. According to the above-described procedures, there are a number of times where a TCP segment 106 is received and has passed TCP checksum, but is dropped by InLogic 32 without sending a TCP Ack covering the segment (i.e., step S9 of FIG. 3). Conventional procedures would then cause a retransmission attempt of those packets. In particular, in the basic scheme (the so-called "Reno protocol"), a TCP transmitter starts the 'Fast Retransmit' mode when it gets three duplicated Acks (i.e., Acks that do not advance the sequence number of in-order received data). For example, assume two TCP segments A and B, and that segment B follows segment A in TCP order. If segment A is dropped, then the receiver would send a duplicate Ack only when it receives segment B. This duplicate Ack would indicate "I'm waiting for segment A, but received another segment," i.e., segment B. In the 'Fast Retransmit' mode under the Reno protocol, the transmitter sends one segment, then it waits for another three duplicate Acks to retransmit another packet. More advanced schemes (like the so-called "New-Reno protocol") allow retransmitting of a segment for each received duplicate in its 'Fast Recovery' mode. The logic behind this process being that if one segment left the network, then the transmitter may put another packet to the network.

In order to facilitate re-transmission, according to an alternative embodiment of the invention, InLogic 32 generates a first duplicate TCP acknowledgement (Ack) covering a received TCP segment that is determined to be valid by TCP and was dropped by TCP based on an upper layer protocol (ULP) decision (e.g., at step S9 of FIG. 3); and transmits the duplicate TCP Ack. The ULP, as noted above, may include one or more of: an MPA protocol, a DDP protocol, and a RDMA protocol. The first duplicate TCP Ack is generated for a TCP segment regardless of whether the TCP segment is in-order or out-of-order, and even where a next in-order TCP segment has not been received. InLogic 32 may also generate a second duplicate TCP acknowledgement (Ack) covering a next out-of-order received TCP segment, and transmit the second duplicate TCP Ack.

This above processing effectively means generation of a duplicate Ack (e.g., for segment A in example above) even though the next in-order segment (e.g., segment B in example above) may not have been received yet, and thus should speed up a process of re-entering the transmitter to the fast path mode under the above-described retransmission rules. More specifically, even if segment B has not been received, the transmitter would know that segment A, a valid TCP segment, was received and dropped due to ULP considerations. As a result, the additional duplicate Ack forces the transmitter to begin the retransmit procedure earlier where a number of duplicate Acks must be received before retransmission begins. This approach does not violate TCP principles, since TCP segment 106 has been successfully delivered to the ULP, and dropped due to ULP considerations (invalid CRC). Therefore the packet was not dropped or reordered by the IP protocol. This approach is particularly valuable when RNIC 16 implements the limited retransmission attempt mode as outlined relative to FIG. 4A, i.e., an Ack is sent at step S103.

E. CRC Calculation and Validation

Conventional processing of incoming Ethernet frames starts with a filtering process. The purpose of filtering is to separate valid Ethernet frames from invalid ones. "Invalid frames" are not corrupted frames, but frames that should not be received by RNIC 16, e.g., MAC filtering—frame selection based on MAC addresses, virtual local area network (VLAN) filtering—frame selection based on VLAD Tags, etc. The valid frames, that were allowed to get into RNIC 16, are also separated into different types. One of these types is a TCP segment. The filtering process is done on the fly, without any need to perform store-and-forward processing of the entire Ethernet frame.

The next step of TCP segment processing is TCP checksum calculation and validation. Checksum calculation determines whether data was transmitted without error by calculating a value at transmission, normally using the binary values in a block of data, using some algorithm and storing the results with the data for comparison with the value calculated in the same manner upon receipt. Checksum calculation and validation requires store-and-forward processing of an entire TCP segment because it covers an entire TCP segment payload. Conventionally, calculation and validation of cyclical redundancy checking (CRC) normally follows TCP checksum validation, i.e., after a connection is recognized as an RDMA connection and after the boundaries of a DDP segment have been detected either using a length of a previous DDP segment or MPA markers. CRC calculation and validation determines whether data has been transmitted accurately by dividing the messages into predetermined lengths which, used as dividends, are divided by a fixed divisor. The remainder of the calculation is appended to the message for comparison with an identical calculation conducted by the receiver. CRC calculation and validation also requires store-and-forward of an entire DDP segment, which increases latency and requires large data buffers for storage. One requirement of CRC calculation is to know DDP segment boundaries, which are determined either using the length of the preceding DDP segment or using MPA markers 110 (FIG. 1B). The marker-based determination is very complicated due to the many exceptions and corner cases. CRC calculation of a partially received DDP segment is also a complicated process.

In order to address the above problems, as shown in FIG. 2C, the present invention performs CRC calculation and validation via CRC logic 64 in parallel with TCP checksum calculation and validation via TCP checksum logic 66 using the same store-and-forward buffer 68. In addition, the present invention does not immediately locate DDP segment boundaries, and then calculate and validate DDP segment CRC. Rather, the present invention switches the order of operations by calculating CRC and later determining DDP boundaries. In order to make this switch, CRC logic 64 assumes that each TCP segment (before it is known that the segment belongs to an RDMA connection) starts with an aligned DDP segment. In addition, the present invention assumes that the first two bytes of a TCP payload 127 (FIG. 1B) is an MPA length field 114 (FIG. 1B) of an MPA frame. This length is then used to identify the DDP segment boundaries and calculate CRC for that segment. After validation unit 44 identifies a boundary of the first possible DDP segment 112 in TCP segment 106, it calculates and validates CRC for that DDP segment simultaneously with the checksum calculation for that portion of TCP segment payload 127, and then proceeds to the next potential DDP segment 112 (if any) contained in the same TCP segment 106. For each "potential" DDP segment discovered in TCP segment 106, CRC validation results may be valid, invalid or too long. Results of CRC validation are stored for use as described above relative to FIG. 3.

In order to actually calculate CRC as described above, when the payload of a TCP segment 106 is processed, InLogic 32 needs to know where MPA markers 110 are in a TCP segment 106. As discussed above relative to FIG. 1B, MPA markers 110 are placed every 512 bytes apart in a TCP segment 106, and the first MPA marker is 512 bytes from an Initial Sequence Number in TCP header 126 (FIG. 1B), which is stored as StartNum field 248 (FIG. 2B) of connection context 42. Unfortunately, an evaluation of each MPA marker 110 does not reveal its position relative to StartNum 248 (FIG. 2B). In addition, MPA markers 110 are covered by CRC data 116, but are not included in an MPA length field 114, which includes only the payload of an MPA frame. Accordingly, to identify MPA markers 110, RNIC 16 needs to know StartNum 248 (FIG. 2B), which must be fetched from connection context 42. Unfortunately, reading connection context 42 is very inconvenient to conduct during TCP processing as it occurs very early in processing and breaks up or holds up packet processing.

In order to reduce or eliminate connection context 42 fetching, the present invention presents four alternatives allowing correct calculation of DDP segment 112 length, which is required to calculate and validate MPA CRC of that segment. These options are discussed in the following sections.

1. Connection Context Prefetch Method

A first alternative embodiment for correctly calculating DDP segment 112 length includes implementing a connection context 42 prefetch of an Initial Sequence Number stored as StartNum field 248 (FIG. 2B). No change to the MPA specification is proposed here. The current MPA specification requires knowledge of an Initial Sequence Number (StartNum) to identify the location of an MPA marker 110 in a TCP segment 106. The Initial Sequence Number is a TCP connection attribute, which varies from connection to connection and is negotiated at connection establishment time. Therefore, a StartNum 248 (FIG. 2B) is maintained on a per connection basis. To identify the location of MPA marker 110, CRC logic 64 (FIG. 2C) checks that the remainder of a particular segment's sequence number (SeqNum) and StartNum (SeqNum−StartNum) mod 512 is zero. That is, because each TCP segment 106 header carries the sequence number of the first byte of its payload, CRC logic 64 can determine where to look for a marker by taking a difference between the particular segment's sequence number and StartNum 248, and then starting from this position, locate a marker every 512 bytes. The MPA specification defines the above-described marker detection method. In this way, a Hash lookup (based on TCP tuple) and a connection context 42 prefetch can be performed before the TCP checksum validation is performed. This is a normal connection context 42 fetch flow. If RNIC 16 wants to get connection context 42, it first needs to understand where this context is located, or get the Connection ID. TCP segment 106 header carries TCP tuple (IP addresses (source and destination) and TCP ports (source and destination)). Tuple is an input to Hash function. The output of Hash function is a Connection ID. Of course, the same Connection ID for different tuples may result, which is called "collision." To handle collisions, RNIC 16 reads connection context 42, checks the tuple in connection context 42 with the tuple in the packet, and if it does not match, then RNIC 16 gets the pointer to the next connection context 42. RNIC 16 keeps checking tuples until it either finds the match, or the segment is recognized as one that does not belong to any known connection. This process allows locating MPA markers 110 in TCP stream. As a result, CRC calculation and validation can be performed simultaneously with TCP checksum validation.

2. Initial Sequence Number Negotiation Method

In a second alternative embodiment, correctly calculating DDP segment length is possible without connection context fetching by making a number of changes to the MPA specification. First, the definition of MPA marker 110 placement in the MPA specification is changed. One disadvantage of the above-described Connection Context Prefetch Method is the need to perform a Hash lookup and connection context 42 prefetch to identify boundaries of the MPA frame 109 in a TCP segment 106. In order to prevent this, the present invention places MPA markers 110 every 512 bytes rather than every 512 bytes starting with the Initial Sequence Number (SN)(saved as StartNum 248) (which necessitates the above-described SN-StartNum mod 512 processing). In this fashion, MPA markers 110 location may be determined by a sequence number mod 512 process to locate MPA markers 110, and no connection context 42 fetch is required.

Figure 7:
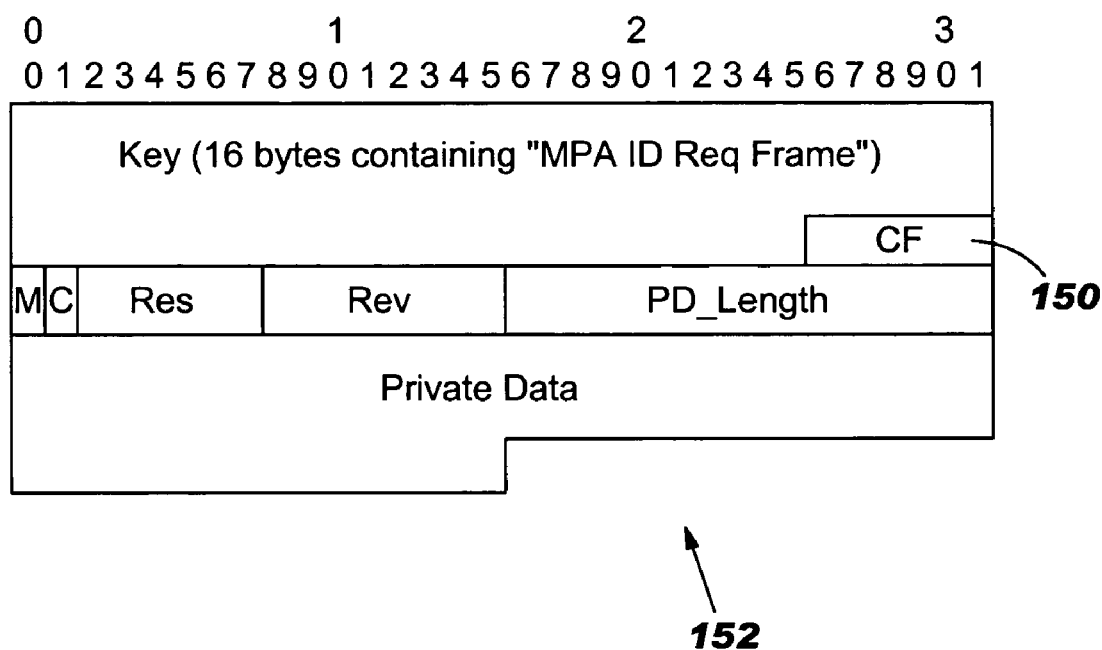
FIG. 7 shows an MPA request/reply frame for use with an initial sequence number negotiation implementation for cyclical redundancy checking (CRC) calculation and validation.

A second change to the MPA specification according to this embodiment acts to avoid the situation where one marker is split between two DDP segments 112, i.e., where an Initial Sequence Number is not word-aligned. As a result, a sequence number mod 512 process may not work in all circumstances because the standard TCP implementation allows the Initial SN to have a randomly generated byte-aligned value. That is, whether an Initial Sequence Number is word-aligned is not controllable by RNIC 16. As a result, a TCP stream for the given connection may not necessarily start with an MPA marker 110. Accordingly, if CRC logic 64 picks the location of a marker 110 just by using the sequence number mod 512 process, it could get markers placed to the byte aligned location, which is unacceptable. To avoid this situation, the present invention adds padding to MPA frames exchanged during an MPA negotiation stage, i.e., the so called "MPA request/reply frame," to make the Initial SN of an RDMA connection when it moves to RDMA mode, word-aligned. That is, as shown in FIG. 7, a correction factor 150 is inserted into an MPA request/reply frame 152 of a TCP segment 106 that includes the number of bytes needed to make the Initial SN word-aligned. It should be recognized that the exact location of correction factor 150 does not have to be as shown. In this way, CRC logic 64 may implement the sequence number mod 512 process to obtain the exact location of the MPA markers 110 in TCP stream without a connection context fetch. Using the above-described modifications of the MPA specification, the invention can locate MPA markers 110 and properly calculate the length of MPA segment without prefetching connection context 42.

3. MPA Length Field Modification Method

In a third alternative embodiment for correctly calculating DDP segment 112 length without connection context fetching, a definition of MPA length field 114 is changed in the MPA specification. Conventionally, MPA length field 114 is defined to carry the length of the ULP payload of a respective MPA frame 109, excluding markers 110, padding 121 (FIG. 1B) and CRC data 116 added by the MPA layer. Unfortunately, this information does not allow locating of MPA frame boundaries using information provided by TCP segment 106. In order to address this, according to this alternative embodiment, the definition of MPA length in the MPA specification is changed to specify a length of the entire MPA frame 109 including: 14 most-significant bits (MSBs) of MPA length field 114, ULP payload 118 length, MPA markers 110, CRC data 116, 2 least-significant bits (LSBs) of MPA length field 114, and valid bits in padding 121.

This revised definition allows detection of MPA frame 109 boundaries using MPA length field 114 without locating all MPA Markers 110 embedded in that MPA frame. MPA layer protocol is responsible for stripping markers 110, CRC data 116 and padding 121 and provide the ULP (DDP Layer) with ULP payload length.

Figure 8:
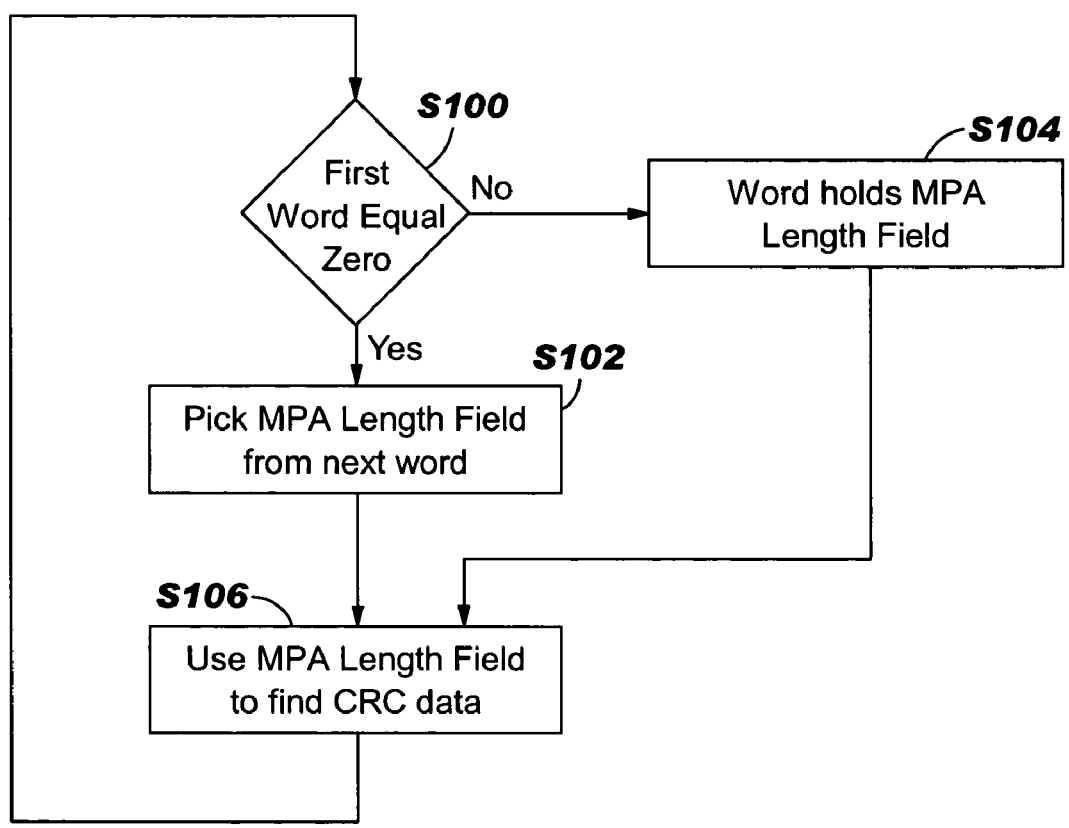
FIG. 8 shows a flow diagram for an alternative modified MPA length implementation for CRC calculation and validation.

Referring to FIG. 8, using this definition of MPA length, CRC logic 64 locates the boundaries of MPA frame 109 by the following process: In step S1100, CRC logic 64 determines whether the first word of an MPA frame 109 equals zero. If YES, then InLogic 32 (FIG. 2A) reads MPA length field 114 from the next word at step S102. This is the case when a marker 110 falls between two MPA frames 109. In this situation, MPA length field 114 is located in the next word as indicated at step S104. If NO is the determination at step S100, then this word holds MPA length field 114. In step S106, the MPA length is used to find the location of the CRC data 116 covering this MPA frame 109. The above process then repeats to locate other MPA frames 109 embedded in TCP segment 106. This embodiment allows locating of MPA frame 109 boundaries without any additional information from connection context 42.

4. No-Markers Cut-Through Implementation

In a fourth alternative embodiment, a no-marker cut-through implementation is used relative to CRC calculation and validation, as will be described below. A disadvantage of the above-described three alternative embodiments for correctly calculating DDP segment length is that each requires modification of the MPA specification or connection context 42 prefetching. This embodiment implements a cut-through processing of inbound segments without prefetching connection context 42 to calculate CRC of arriving MPA frames and without any additional changes to the MPA specification. In addition, this embodiment allows out-of-order direct data placement without use of MPA Markers. This embodiment is based, in part, on the ability of a receiver to negotiate a 'no-markers' option for a given connection according to a recent updated version of the MPA specification. In particular, the updated MPA specification allows an MPA receiver to decide whether to use markers or not for a given connection, and the sender must respect the receiver's decision. This embodiment changes validation unit 44 logic to allow CRC calculation on the fly concurrently with TCP checksum calculation and without prefetching connection context 42.

The CRC calculation is done exactly as described for the case with markers. That is, the present invention assumes that the TCP segment starts with aligned DDP segment, and uses the MPA length field to find the location of CRC, and then calculates and validates CRC. The difference with this embodiment, however, is that there is no need to consider markers when calculating DDP segment length, given MPA length field of the MPA header.

Figure 9:
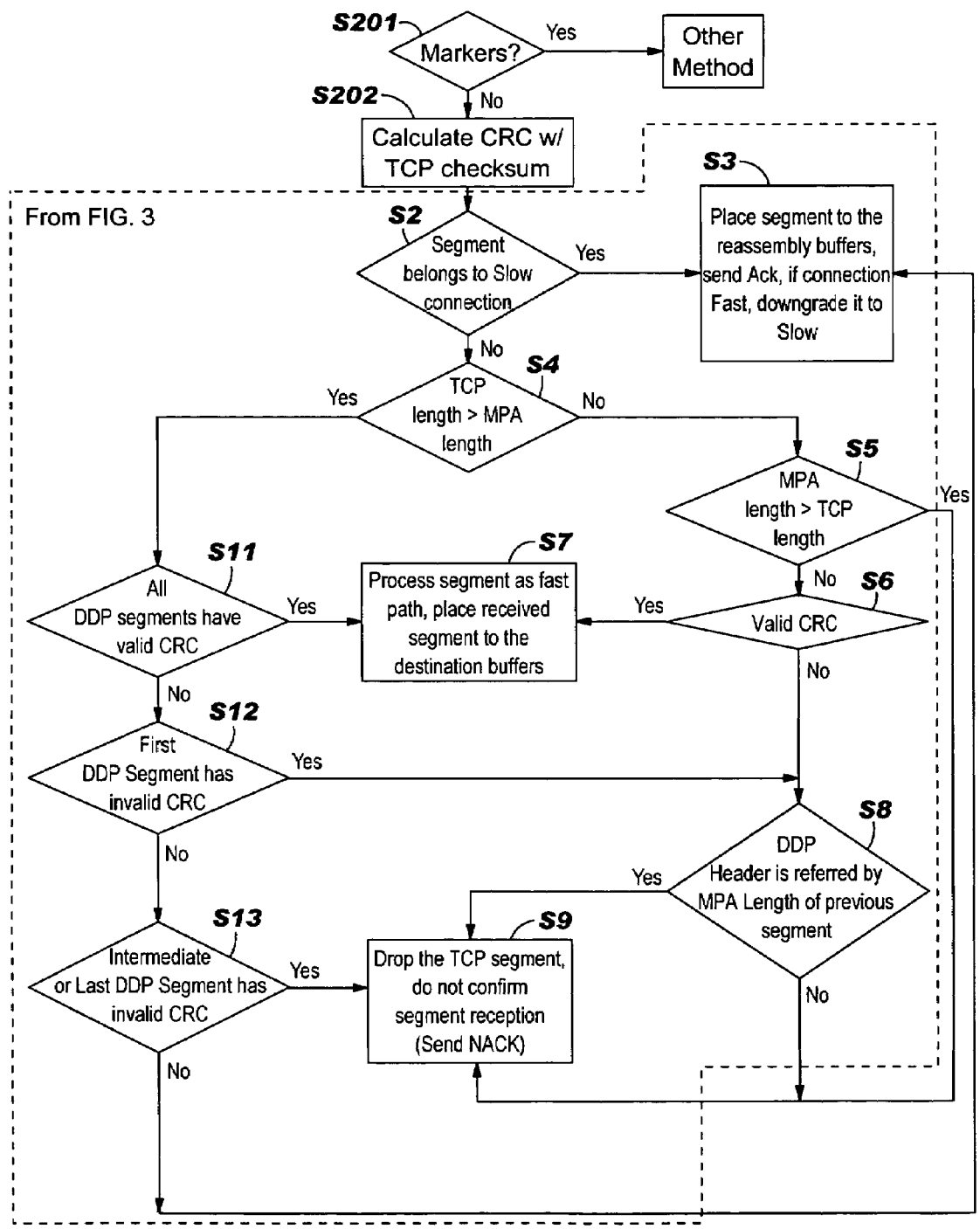
FIG. 9 shows a flow diagram for a first alternative embodiment of InLogic using a no-markers cut-through implementation for CRC calculation and validation.

Referring to FIG. 9, a flow diagram illustrating InLogic 32 functionality relative to a first alternative of this embodiment is shown. It should be recognized that much of InLogic 32 functionality is substantially similar to that described above relative to FIG. 3. For clarity purposes, where InLogic 32 functionality is substantially similar to that described above relative to FIG. 3, the steps have been repeated and delineated with a dashed box.

Under the updated MPA specification, a receiver negotiates a 'no-marker' option for a particular connection at connection initialization time. As shown in FIG. 9, in this embodiment, at step S201, InLogic 32 determines whether inbound TCP segment 106 includes markers 110. If YES, InLogic 32 proceeds with processing as in FIG. 3, and some other method of CRC calculation and validation would be used, as described above. If NO, at step S202, inbound MPA frames 109 have their CRC calculated and validated on the fly using the same store-and-forward buffers 68 as TCP checksum logic 66, but without fetching connection context 42. A determination of whether the connection is a SLOW connection, steps S2 and S3 as in FIG. 3, may also be completed. Results of CRC validation can be one of the following: 1) the length of MPA frame 109 matches the length of TCP segment 106, and MPA frame 109 has a valid MPA CRC; 2) the length of the MPA frame 109 matches the length of TCP segment 106, but MPA frame 109 has an invalid CRC; 3) the length of MPA frame 109 exceeds the length of the TCP segment; and 4) the length of MPA frame 109 is smaller than the length of TCP segment 106.

In case 1), InLogic 32 functions substantially similar to steps S4-S7 of FIG. 3. That is, where MPA frame 109 has a same length as a TCP segment 106 (steps S4 and S5 of FIG. 3), and carries a valid MPA CRC (step S6), the frame is considered to be a valid MPA frame, and is passed to OutLogic 40 for further processing via internal data buffers 38 and to destination data buffers 50 on the fast path mode.

In case 2), where MPA frame 109 has a same length as a TCP segment 106 (steps S4 and S5 of FIG. 3), but has an invalid CRC (step S6 of FIG. 3), InLogic 32 functions differently than described relative to FIG. 3. In particular, since received MPA frame 109 does not contain MPA markers 110, the marker related information cannot be used for recovery (as in step S110 of FIG. 3). This leaves only two cases that need to be addressed: Case A: when MPA frame 109 is referred by the length of the previously received segment (and validated) MPA frame 109 (as determined at step S8 of FIG. 3); and Case B: all other cases. In Case A the MPA frame 109 is corrupted, and in Case B, MPA frame 109 can be either corrupted or not aligned. In both cases the received TCP segment 106 is dropped (step S9 of FIG. 3), and receipt is not confirmed. In this case, the limited retransmission attempt mode described relative to FIG. 4 may be implemented to recover from the drop of that TCP segment 106, which allows the sender to retransmit the dropped TCP segment 106 and resolve any potential data corruption. If MPA frame 109 was not aligned to TCP segment 106, then the limited retransmission attempt mode will end with downgrading of the connection to a SLOW connection, as described above.

In case 3), where the length of MPA frame 109 exceeds a length of TCP segment 106 (step S5 of FIG. 3), either MPA frame 109 is not aligned to TCP segment 106, or the length is corrupted. In this case, the received TCP segment 106 is dropped (step S9 of FIG. 3), and TCP does not confirm receipt. In this case, again, the limited retransmission attempt mode described relative to FIG. 4 may be implemented to recover from the drop of that TCP segment 106, which allows the sender to retransmit the dropped TCP segment and resolve any potential data corruption. Again, if MPA frame 109 is not aligned to TCP segment 106, then the limited retransmission attempt mode will end with downgrading of the connection to a SLOW connection, as described above.

In case 4), where the length of MPA frame 109 is smaller than the length of TCP segment 106 (step S4 of FIG. 3), or TCP segment 106 potentially carries multiple MPA frames 109 (sender exercises a packing option), InLogic 32 sequentially checks the CRCs of all DDP segments 112 embedded in the received TCP segment 106 (steps S11-S13 of FIG. 3). If all DDP segments 112 have a valid CRC, InLogic 32 approves reception of that TCP segment 106, and all MPA frames are forwarded for the further processing on the fast path mode (step S7 of FIG. 3). If one of DDP segments 112 has an invalid CRC, or the last segment is not fully contained in the TCP segment (steps S12-S13 of FIG. 3), the entire TCP segment is dropped (step S9 of FIG. 3), and InLogic 32 does not confirm reception of that TCP segment. As above, the limited retransmission attempt mode described relative to FIG. 4 may be implemented to recover from the drop of that TCP segment 106, which allows the sender to retransmit the dropped TCP segment and resolve any potential data corruption. If MPA frame 109 was not aligned to TCP segment 106, then the limited retransmission attempt mode will end with downgrading of the connection to a SLOW connection, as described above.

Figure 10:
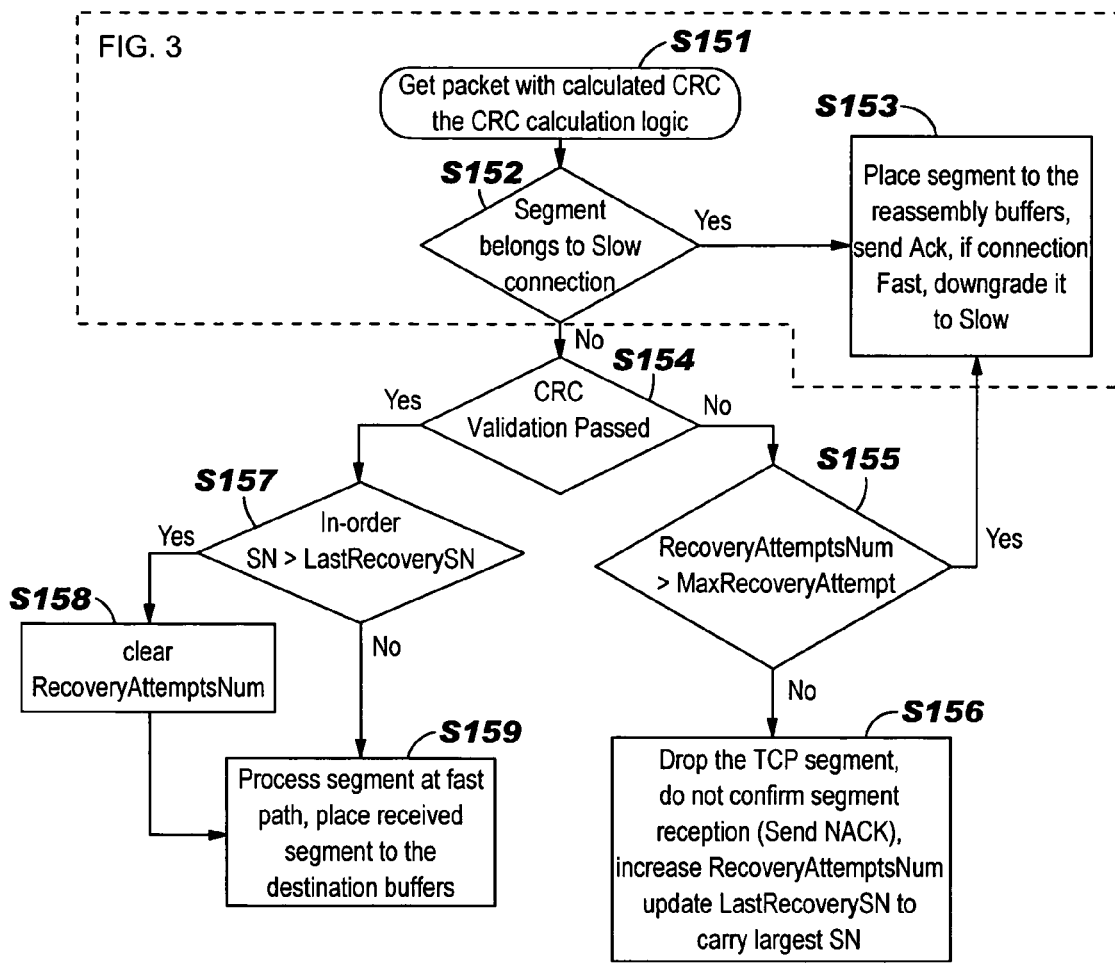
FIG. 10 shows a flow diagram for a second alternative embodiment of InLogic using the no-markers cut-through implementation for CRC calculation and validation.

Turning to FIG. 10, another alternative flow diagram illustrating InLogic 32 functionality relative to this embodiment, and including aspects of the Limited Retransmission Attempt Mode and TCP Retransmit Speed-Up is shown. In contrast to FIG. 9, InLogic 32 functionality is greatly simplified compared to FIG. 3. For clarity purposes, where InLogic 32 functionality is substantially similar to that described above relative to FIG. 3, the steps have been repeated and delineated with a dashed box.

In FIG. 10, steps S151-S153 are substantially identical to step S1-S3 of FIG. 3. At step S154, InLogic 32 determines whether CRC validation passed. This evaluation is different than step S4 in FIG. 3 in that instead of providing an indication per DDP segment, CRC logic 54 provides a CRCValidationPassed bit that indicates success or failure of CRC validation of all DDP segments in a received TCP segment. This bit is set if the CRC validation passed for all DDP segments contained in received TCP segment, and is cleared if either the CRC validation failed for one of the segments, or the last (only) segment was too long. If NO, InLogic 32 proceeds to step S155, where a determination as to whether RecoveryAttemptsNum (field 292 of FIG. 2B) is greater than MaxRecoveryAttemptsNum (field 296 of FIG. 2B). If YES, then InLogic proceeds to step S153 where the DDP segment is placed to reassembly buffers 34, an Ack is sent, and the connection is downgraded to a SLOW connection (if it was a FAST connection). If NO at step S155, then at step S156, the TCP segment 106 is dropped and no confirmation is scheduled. In addition, RecoveryAttemptNum (field 292 of FIG. 2B) is increased by one, and the LastRecoverySN (field 294 of FIG. 2B) is updated.

Returning to step S154, if the determination results in a YES, InLogic 32 proceeds, at step S157, to determine whether a newly received in-order data transfer's sequence number (In-order SN) is greater than LastRecoverySN (field 294 of FIG. 1B). If YES, then at step S158, InLogic 32 clears RecoveryAttemptsNum (field 292 in FIG. 1B), i.e., sets it to zero. If NO at step S157 or subsequent to step S158, at step S159, the segment is processed on the "fast path mode" by placing the segment to destination data buffers 50. Step S159 may also include implementation of the duplicate Ack, as discussed above relative to the TCP Retransmit Speed-Up option.

The above-described FIG. 10 embodiment implements the cut-through mode of the invention plus the limited retransmission attempt mode and TCP retransmit speed-up option without use of MPA markers.

III. OutLogic

OutLogic 40 (FIG. 2A) performs in-order delivery of RDMA messages without keeping information per RDMA message. There are two situations that are addressed: 1) for all RDMA Messages excepting a Send message, and 2) an RDMA Send message.

Returning to FIGS. 1F-1H, operation of OutLogic 40 (FIG. 2A) will now be described. OutLogic processes aligned DDP segments 220 from internal data buffers 38 (FIG. 2A) that were placed there on the fast path mode, as described above, and conducts data placement and delivery of the aligned DDP segments to a receiver's data buffers. As used herein, "placement" refers to the process of actually putting data in a buffer, and "delivery" refers to the process of confirming completion of a data transfer. "Placement" may be applied to both segments and messages, while "delivery" applies to messages only. Under the RDMA protocol, aligned DDP segments may be placed in an out-of-order fashion, but delivery does not occur until all of the aligned DDP segments are placed in-order. For example, for three aligned DDP segments 1, 2 and 3, where segments 2 and 3 are first placed without segment 1, delivery does not occur until segment 1 is placed.

A. Placement

With regard to placement, OutLogic 40 provides conventional placement of RDMA messages except relative to RDMA Read messages, as will be described below.

With regard to tagged DDP segments, for example, returning to FIG. 1D, according to the RDMA protocol, a header 124 of a tagged DDP segment carries an address of the receiver's previously registered memory region (e.g, memory region 232 in FIG. 1G). As indicated above, this address includes starting tag (STag) indicating a destination buffer that lies in memory region/window (e.g., memory region 232 in FIG. 1G for an RDMA Write message), a target offset (TO) in this region/window and a transaction length (segment payload). In this case, data placement is conducted by OutLogic 40 in a conventional manner, without retrieving any additional information from connection context 42 (FIG. 2A). Conventional Address Translation and Protection (ATP) processes, in which the STag and TO are translated to a list of physical buffers of a memory region describing the destination data buffer, precedes the data placement by OutLogic 40.

Relative to untagged DDP segments such as an RDMA Read message, referring to FIG. 1H, the RDMA protocol defines the maximal number of pending inbound Read Requests 222, which is exchanged at negotiation time. Each RDMA Read message 204 consumes a single DDP segment 222. When RNIC 16 receives RDMA Read message 204, it posts an RDMA Read Response WQE 216RR to a Read Queue 214. In another example, referring to FIG. 1F, each Send message 200 is placed to receive queue (RQ) 212 of a responder, e.g., data sink 18 (FIG. 2A). As noted above, each receive queue (RQ) 212 is a buffer to which control instructions are placed, and includes a WQE 216R to which a payload is placed. Receive queue (RQ) 212 includes WQEs 216R. Each WQE 216R holds control information describing a receive WR 208R posted by a consumer. Each WQE 216R also points on consumer buffer(s) posted in that WR 208R. Those buffers are used to place the payload. Accordingly, each message 200 consumes a WQE 216R.

Figure 1D:
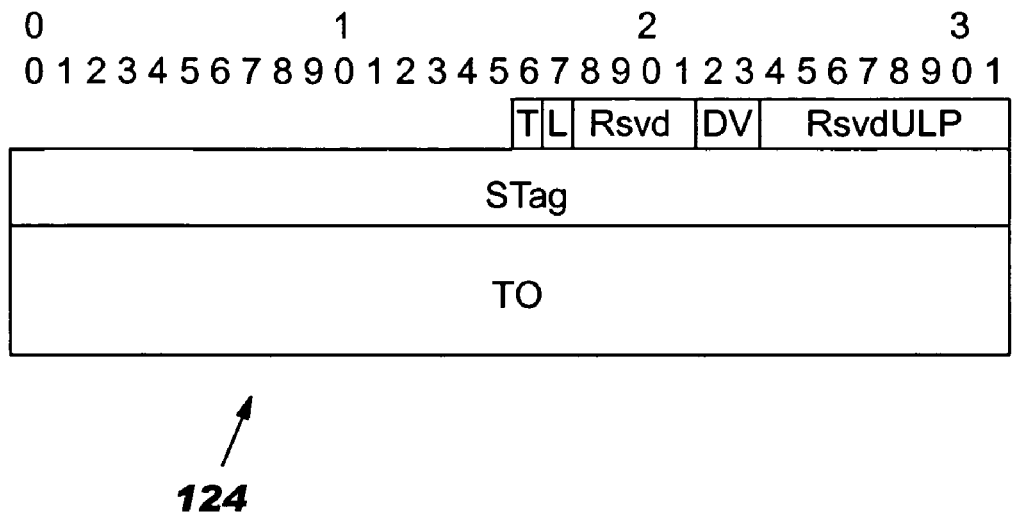
FIG. 1D shows a block diagram of a conventional tagged DDP header.
Figure 1E:
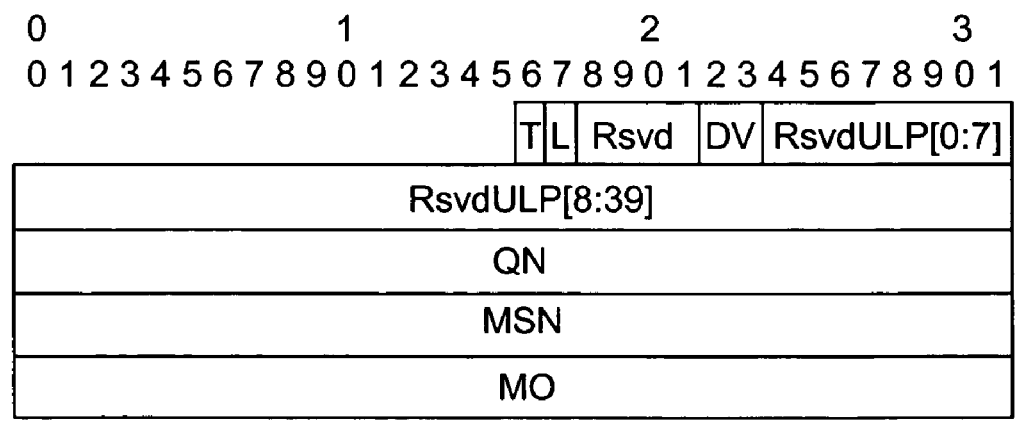
FIG. 1E shows a block diagram of a conventional untagged DDP header.
Figure 11:
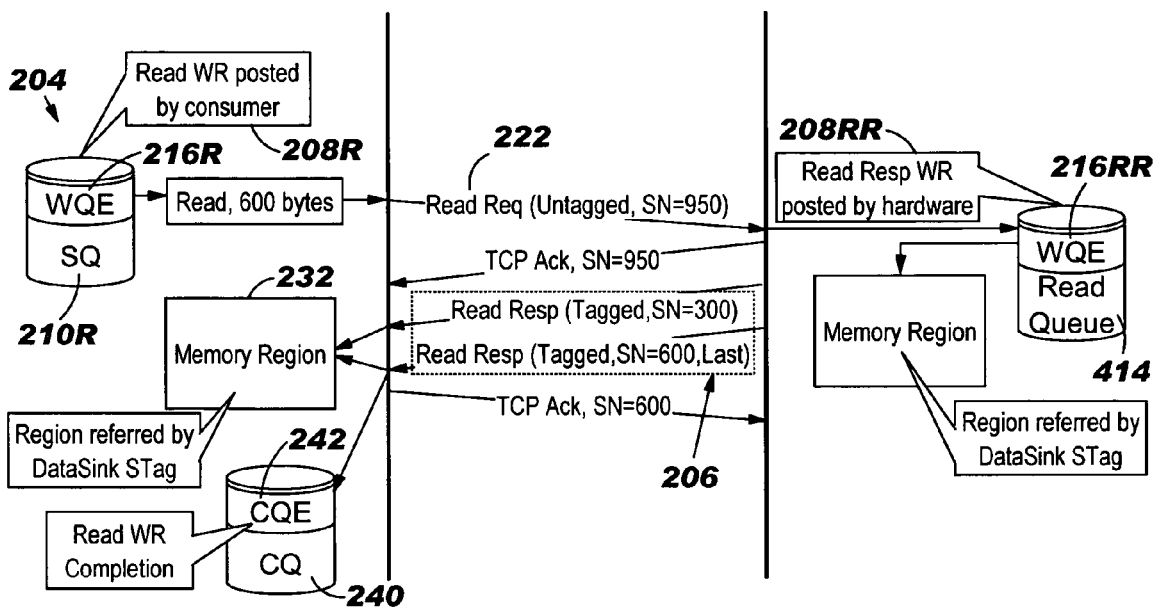
FIG. 11 shows a block diagram of RDMA Read and Read Response message data transfers including a Read Queue according to the invention.

Referring to FIG. 11, a representation of an RDMA Read message 204 and RDMA Read Response 206 similar to FIG. 1H is shown. In accordance with the invention, however, a Read Queue 414 is provided as a special work queue (WQ) implemented as a cyclic buffer, and each entry of this cyclic buffer is a WQE 216RR describing the RDMA Read Response that needs to be generated by transmit logic. This allows easy and efficient placement of out-of-order RDMA Read Requests 222 since for each inbound RDMA Read Request there is a well known location in the Read Queue 414, i.e., WQE 216RR. For example, when RDMA Read message #3 is received and RDMA Read message #2 is lost, RDMA Read message #3 is placed. This placement is done upon reception of RDMA Read Request message 222, i.e., message sent due to posting of Read WR 208R on requester. Location of WQE 216RR in Read Queue 414 is identified by the MSN in RDMA Read message header 124 (FIG. 1D).

B. Delivery

The RDMA protocol allows out-of-order data placement but requires in-order delivery. Accordingly, conventional implementations require maintaining information about each message that was placed (fully or partially) to the memory, but not delivered yet. Loss of a single TCP segment, however, can lead to the reception of many out-of-order RDMA messages, which would be placed to the destination buffers, and not completed until the missing segment would be retransmitted, and successfully placed to the memory. Under conventional circumstances, limited resources are available to store an out-of-order stream such that only a certain number of subsequent messages can be stored after an out-of-order stream is received.

According to the invention, however, instead of holding some information for each not delivered RDMA message and therefore limiting the number of supported out-of-order received messages, an unlimited number of not delivered RDMA messages are supported by storing information on a per TCP hole basis. A "TCP hole" is a term that describes a vacancy created in the TCP stream as a result of reception of an out-of-order TCP segment.

Figure 12:
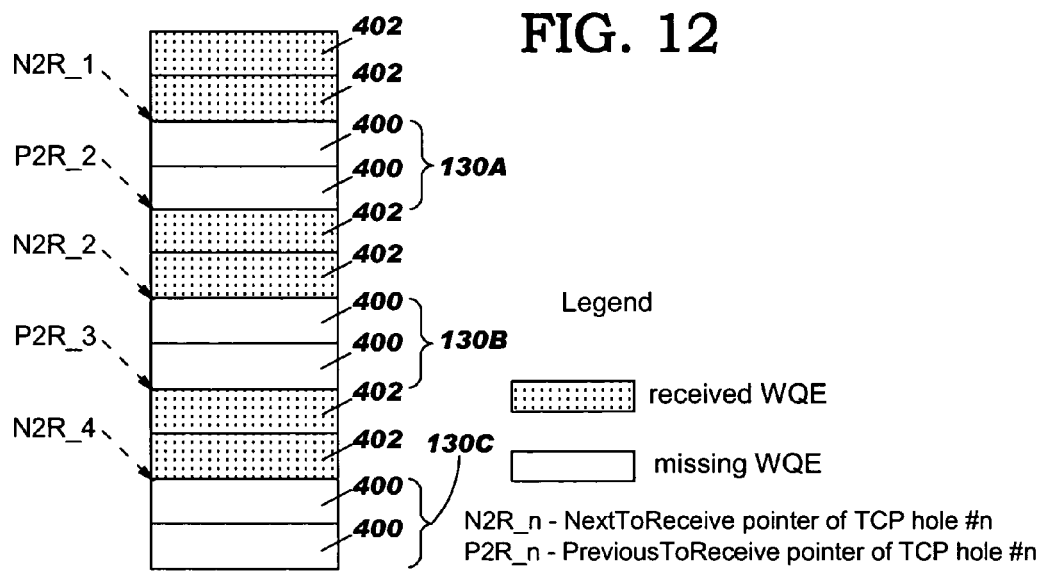
FIG. 12 shows a block diagram of work queue elements (WQEs) and TCP holes for messages processed by RNIC output logic (i.e., OutLogic).

Referring to FIG. 12, white blocks indicate missing TCP segments 400 that form TCP holes 130A-130C, and shaded/gray blocks 402 indicate a continuously received TCP stream. Per TCP hole 130A-130C information is stored in connection context 42 (FIG. 2B). A limited number of supported TCP holes 130A-130C is a characteristic inherited from the TCP protocol implementation. In particular, the TCP protocol usually limits the number of supported TCP holes 130A-130C to, for example, one, two or three holes. Typically, support of limited number of TCP holes 130A-130C effectively means that when an out-of-order TCP segment arrives, opening a new TCP hole, this segment is dropped by TCP logic. FIG. 12 illustrates a three-TCP hole implementation. In this case, if a new segment arrives after the bottom TCP hole 130C, i.e., after the two bottom missing segments 400, this segment will "open" a fourth hole that is not supported. As a result, that segment would be dropped.

In order to address this situation, the present invention implements tracking of TCP holes 130 (FIG. 12) via connection context 42 (FIGS. 2A and 2B) rather than tracking of out-of-order messages/segments. In particular, as shown in FIG. 2B, the invention stores a PendingReadResponseNum field 300 to count completed RDMA Read Requests, a CompletedSendsNum field 302 to count completed Send messages and a CompletedReadResponseNum field 306 to count completed RDMA Read Responses. As those skilled in the art should recognize, other fields may be required for each hole, the description of which will not be made for brevity sake. This approach allows an unlimited number of out-of-order received RDMA messages waiting for completion and in-order delivery. This approach does not limit ability to share a completion queue 240 (FIGS. 1F-1H) both by receive 212 and send 210 queues without any limitation. The details of handling of particular types of messages will now be described.

First, it should be recognized that delivery of RDMA Write messages 202 (FIG. 1G) does not lead to any report to a responder, or any notification to other hardware logic because of the nature of the operation. Accordingly, no delivery concerns exist relative to this type RDMA message.

Second, returning to FIG. 11, with regard to an RDMA Read Response message 206, this operation represents the completion of a pending RDMA Read message 204. In this case, storing a CompletedReadResponseNum field 306 (FIG. 2B) in connection context 42 that includes a number of completed RDMA Read Response messages 206 per TCP hole 130 is sufficient to provide completion handling logic of the requester with enough information to complete pending RDMA Read work requests 208R. When the TCP hole closes, the number of completed RDMA Read Responses associated with this hole is reported to completion handling logic of the requester to indicate completion of pending RDMA Read work requests 208R.

With regard to RDMA Read Requests, operation of WQE 216RR post includes two steps: placement of WQE 216RR to Read Queue 414, and a notification, i.e., doorbell ring, to notify RNIC 16 that this WQE can be processed. Placement of WQE 216RR can be done out-of-order. However, as noted above, the start of the WQE processing (and thus doorbell ring) must be compliant to RDMA ordering rules. That is, the RDMA protocol requires delay of processing of inbound RDMA Read messages 204 until all previously transmitted RDMA messages of any kind are completed. Thus, the doorbell ring, i.e., notification, should be delayed until all in-order preceding RDMA Read messages 204 are completed. A single doorbell ring, i.e., notification, can indicate posting of several WQEs 216RR.

To resolve the above problem, RNIC 16 according to the invention stores in connection context 42 (PendingReadResponseNum field 300 (FIG. 2B)) the number of posted RDMA read response WQEs 216RR waiting for the doorbell ring (notification) for each TCP hole 130 (FIG. 1B). When a TCP hole 130 is closed, RNIC 16 rings the doorbell (notifies) to confirm posting of PendingReadResponseNum WQEs 216RR to Read Queue 214. This indicates that all preceding read messages 204 have been completed, and RNIC 16 can start processing of the posted read response WQEs 216RR.

Figure 13:
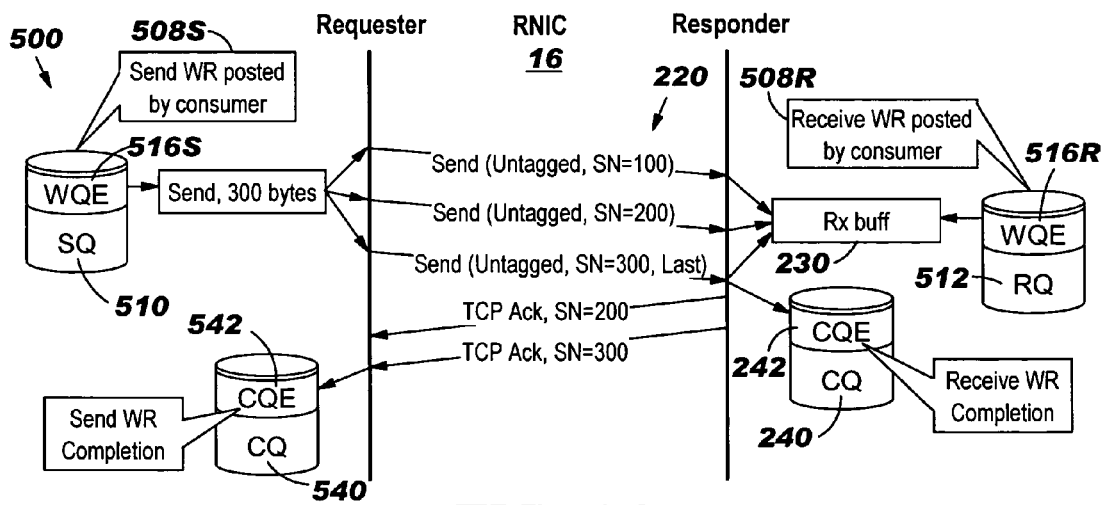
FIG. 13 shows a block diagram of RDMA Send message data transfers including a completion queue element (CQE) according to the invention.

Referring to FIG. 13, an RDMA Send message 500 represents a unique situation. In particular, delivery of a completed Send message includes placing of a CQE 542 to CQ 540. CQE 542 carries information describing the completed message (e.g., length, Invalidate STag, etc.). This information is message specific information, and therefore should be kept for each pending Send message 500. RNIC 16 cannot place a CQE 542 before a Send message 500 has been completed (similarly to the placement of RDMA Read Response WQE 508RR in received Read work requests 508R), because a CQ 540 can be shared by several send 510 and receive 512 queues, as indicated above.

To resolve this issue without consuming additional RNIC resources, and providing scalable implementation, OutLogic 40 according to the present invention places all information that needs to be included in CQE 542 to the WQE 516R consumed by that Send message 500. This information is then retrieved from WQE 516R by verb interface 20 (FIG. 2A) upon a Poll-For-Completion request. RNIC 16 needs to keep the number of completed send messages 500 (in CompletedSendsNum field 302) per TCP hole 130 in connection context 42, which is used to post CQEs 542 to CQ 540, when corresponding TCP hole closes. When the TCP hole 130 closes, RNIC 16 places CQEs 542 to CQ 540. The number of CQEs 542 to be placed equals the number of completed Send messages 500 counted for this hole. This approach involves 2N write operations, when N is a number of completed Send messages 500.

Figure 14:
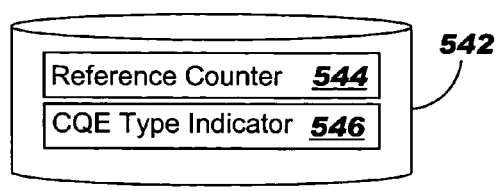
FIG. 14 shows a block diagram of the CQE of FIG. 13.

One disadvantage of the approach presented above relative to delivery of an RDMA Send message 500 is that it doubles the number of write operations performed by RNIC 16. That is, there is one write to WQE 516R and one write of CQE 542 for each completed Send message 500. In order to address this issue, as shown in FIG. 14, according to an alternative embodiment of the present invention, the content of a CQE 542 is changed to carry a reference counter 544 of WQEs 516R that the particular CQE 542 completes. Reference counter 544 is initialized by RNIC 16 to the number of Send messages 500 completed for the given TCP hole 130. Verb interface 20, for each Poll-For-Completion operation, reduces reference counter 544, and removes CQE 542 from CQ 540 only if the counter becomes zero. In addition, RNIC 16 updates a WQE 516S only if it is holds greater than a threshold (M) outstanding Send messages 500 waiting for completion. M is a configurable parameter, indicating an amount of internal resources allocated to keep information for pending inbound Send messages 500. If M equals zero, then any out-of-order received Send message 500 involves update of WQE 516R (no updated is needed for in-order received Send messages 500).

This embodiment also includes defining two kinds of CQEs 542 and providing an indicator 546 with a CQE 542 to indicate whether the CQE is one carrying all completion data in the CQE's body, or one that carries part of completion data with the remainder of the completion information stored in WQE 516R associated with one or more RDMA Send messages. This alternative embodiment reduces the number of write operations to N+1, where N is a number of completed Send messages 500, that were pending before TCP hole 130 was closed.

IV. Conclusion

In the previous discussion, it will be understood that the method steps are preferably performed by a specific use computer, i.e., finite state machine, containing specialized hardware for carrying out one or more of the functional tasks of the invention. However, the method steps may also be performed by a processor, such as a CPU, executing instructions of a program product stored in memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims. In particular, the described order of steps may be changed in certain circumstances or the functions provided by a different set of steps, and not depart from the scope of the invention.

What is claimed is:

1. A system for checking a data transfer for an error, the system comprising:

means for identifying a boundary of the data transfer based on a first assumption that a first two bytes of a transmission control protocol (TCP) payload includes a marker with protocol data unit alignment (MPA) protocol length field;

means for calculating a cyclical redundancy check (CRC) value based on the first assumption and a second assumption that the data transfer includes at least one aligned direct data placement (DDP) segment, wherein the calculating means further calculates a TCP checksum value, and wherein the calculating means calculates the CRC value and the TCP checksum value in parallel; and wherein the data transfer includes an MPA length field that includes an entire MPA frame including: fourteen most-significant bits (MSBs) of the MPA length field, an upper layer protocol (ULP) payload length, all MPA markers, CRC data, two least-significant bits (LSBs) of the MPA length field, and any valid bits in MPA padding.

2. The system of claim 1, wherein the identifying means includes means for fetching an Initial Sequence Number from a connection context and determining a remainder between the Initial Sequence Number and a data transfer sequence number.

3. The system of claim 1, wherein an MPA request/reply frame includes a correction factor including a number of bytes needed to make an initial sequence number of the data transfer word-aligned.

4. The system of claim 3, wherein the identifying means includes means for implementing a sequence number mod 512 process.

5. The system of claim 1, further comprising:

means for determining whether a first word of the MPA frame equals zero;

means for reading the MPA length field from a next word where the first word equals zero; and means for reading the MPA length field from the first word where the first word does not equal zero.

6. The system of claim 1, wherein when the data transfer does not include an MPA marker.

7. A computer program product comprising a computer useable medium having computer readable program code embodied therein for limiting a number of re-transmission attempts for checking a data transfer for an error, the program product comprising:

program code configured to identify a boundary of the data transfer based on a first assumption that a first two bytes of a transmission control protocol (TCP) payload includes a marker with protocol data unit alignment (MPA) protocol length field and wherein the data transfer includes an MPA length field that includes an entire MPA frame including: fourteen most-significant bits (MSBs) of the MPA length field, an upper layer protocol (ULP) payload length, all MPA markers, CRC data, two least-significant bits (LSBs) of the MPA length field, and any valid bits in MPA padding;

program code configured to calculate a cyclical redundancy check (CRC) value based on the first assumption and a second assumption that the data transfer includes at least one aligned direct data placement (DDP) segment; and program code configured to calculate a TCP checksum value in parallel with calculating the CRC value.

8. The program product of claim 7, wherein an MPA request/reply includes a correction factor including a number of bytes needed to make an initial sequence number of the data transfer word-aligned.

9. The program product of claim 8, wherein the identifying program code includes program code configured to implement a sequence number mod 512 process.

* * * * *